(12) United States Patent
Ohara et al.

(10) Patent No.: US 7,944,514 B2
(45) Date of Patent: May 17, 2011

(54) DISPLAY DEVICE AND MANUFACTURING METHOD THEREOF

(75) Inventors: Ken Ohara, Chiba (JP); Yoshiaki Nakayoshi, Oamishirasato (JP); Tsunenori Yamamoto, Hitachi (JP); Susumu Edo, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 757 days.

(21) Appl. No.: 12/015,538

(22) Filed: Jan. 17, 2008

(65) Prior Publication Data

US 2008/0225195 A1  Sep. 18, 2008

(30) Foreign Application Priority Data

Jan. 17, 2007 (JP) ................................. 2007-008310

(51) Int. Cl.
  *G02F 1/1343*  (2006.01)
  *G02F 1/1368*  (2006.01)
  *H01L 27/088*  (2006.01)
(52) U.S. Cl. ............... 349/46; 349/187; 349/43; 349/42; 349/138; 438/29; 438/30; 257/E21.535

(58) Field of Classification Search .................... 349/43, 349/42, 38, 138, 139, 143, 147, 187, 46; 438/29, 30; 257/E27.111, E21.535
See application file for complete search history.

(56) References Cited

U.S. PATENT DOCUMENTS

| | | | |
|---|---|---|---|
| 6,049,369 A * | 4/2000 | Yanagawa et al. | 349/141 |
| 2005/0007533 A1* | 1/2005 | Tanaka et al. | 349/139 |
| 2008/0225195 A1* | 9/2008 | Oohara et al. | 349/46 |

* cited by examiner

*Primary Examiner* — Brian M Healy
(74) *Attorney, Agent, or Firm* — Antonelli, Terry, Stout & Kraus, LLP.

(57) ABSTRACT

The present invention allows decreasing the uneven image quality in a liquid crystal display device. The display device in accordance with the present invention includes plural scan signal lines, plural video signal lines, plural TFTs placed in a matrix structure, and plural pixel electrodes, when the width of the scan signal line in a region to place one TFT is different from the width of the scan signal line in a region to place another TFT which is different from the one TFT, the channel width and the channel length of the one TFT is almost equal to the channel width and the channel length of the another TFT, and the surface area of the region overlapping the source electrode with the scan signal line of the one TFT when viewing in plan view is almost equal to the surface area of the region overlapping the source electrode with the scan signal line of the another TFT when viewing in plan view.

18 Claims, 30 Drawing Sheets

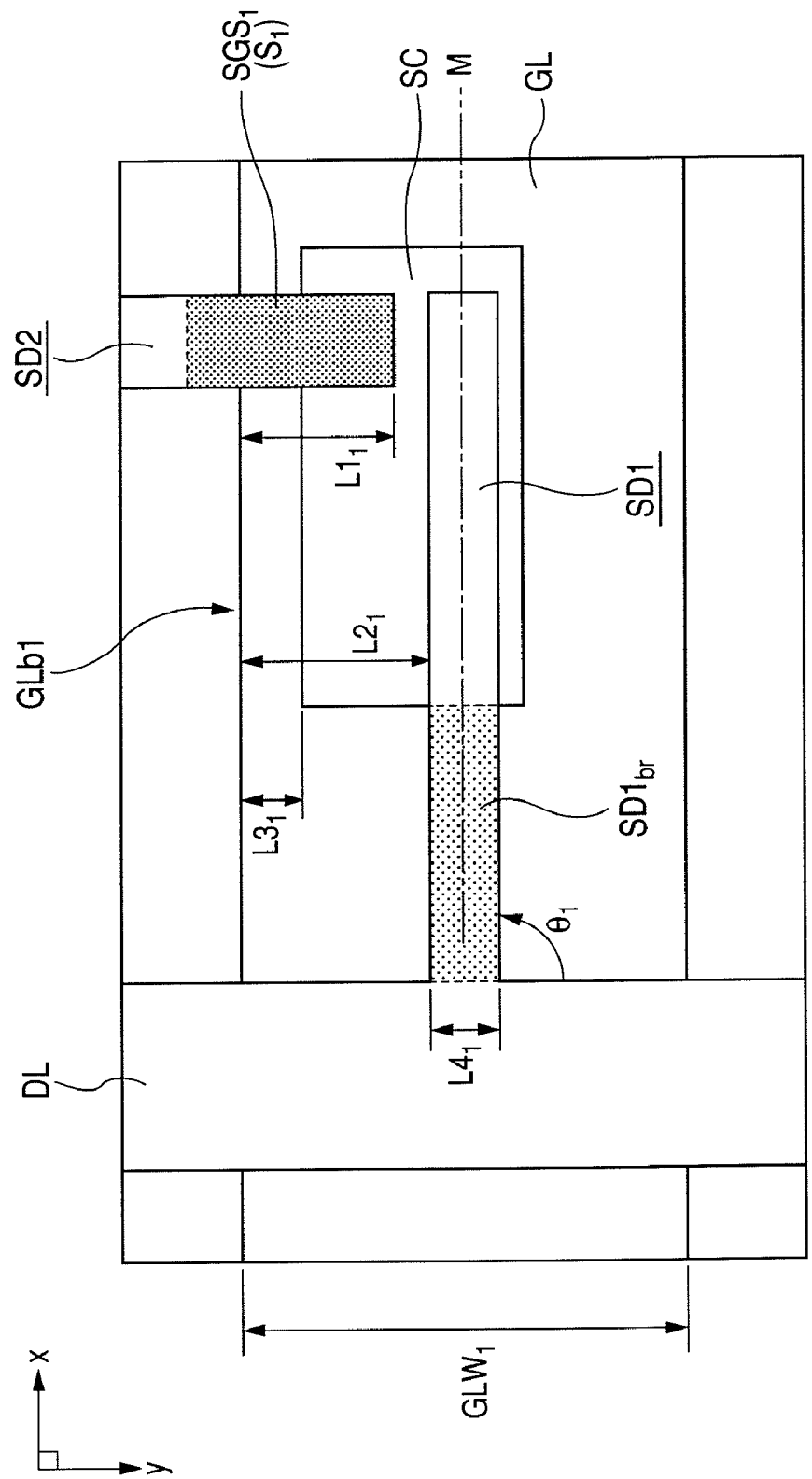

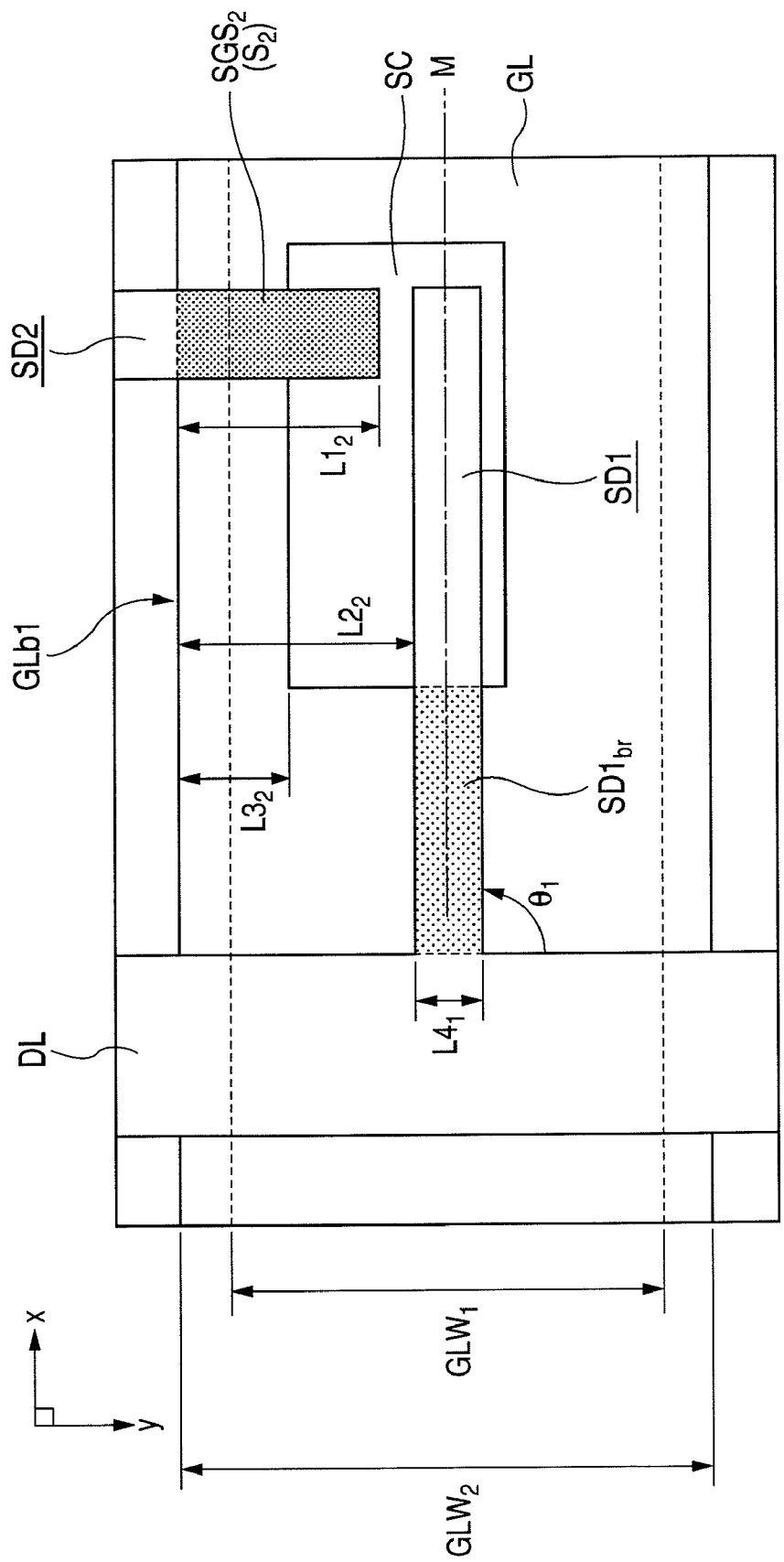

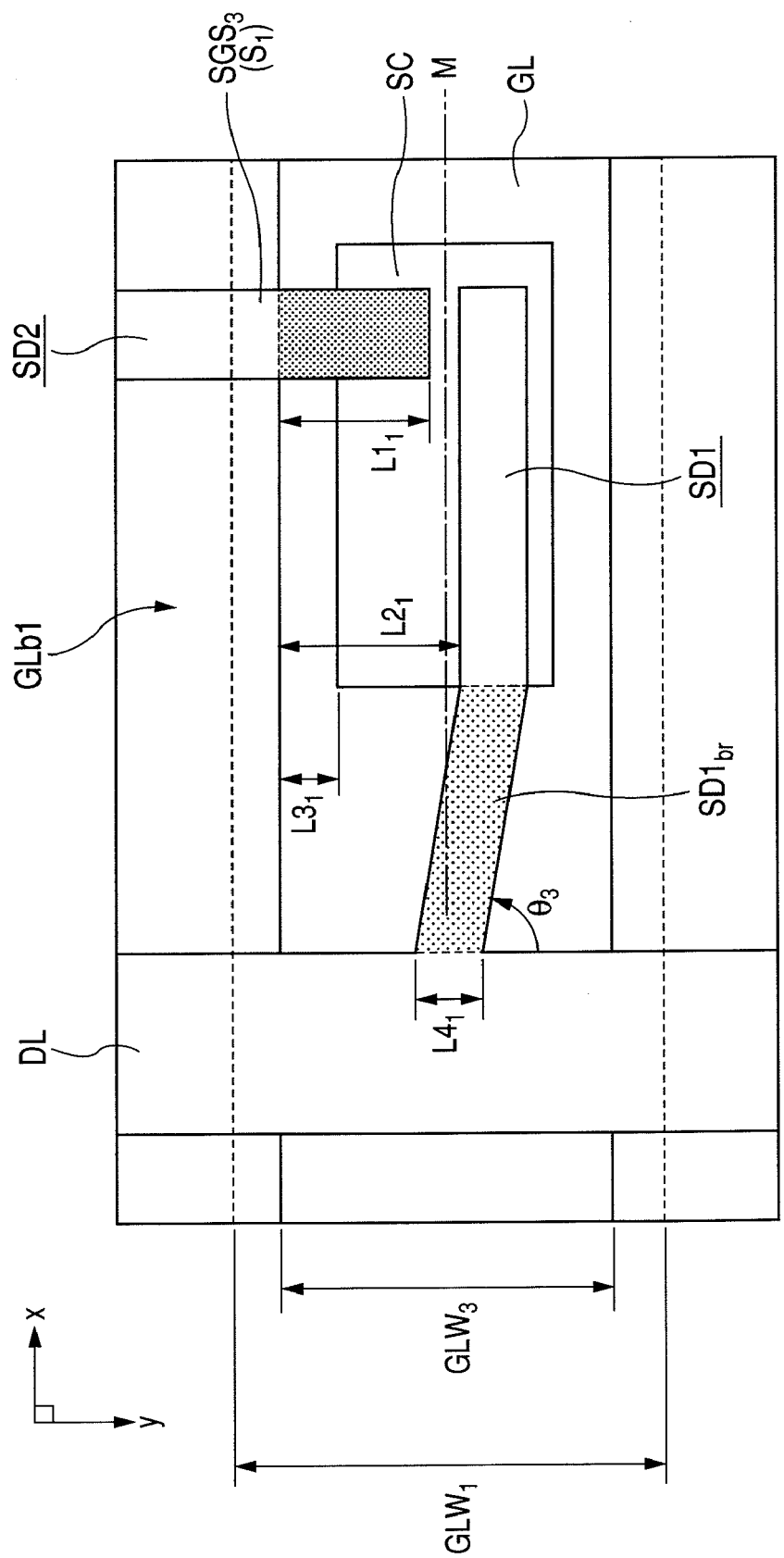

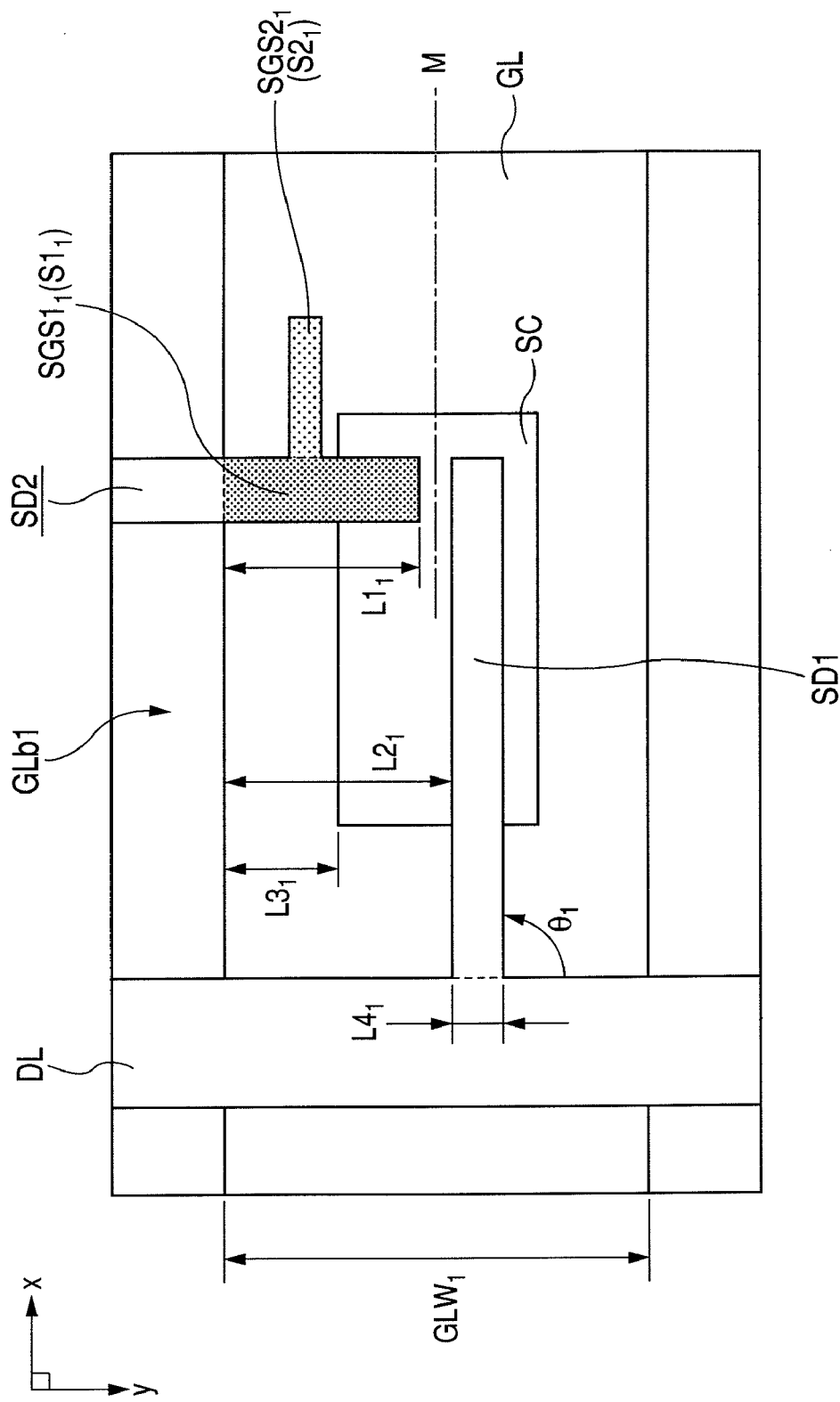

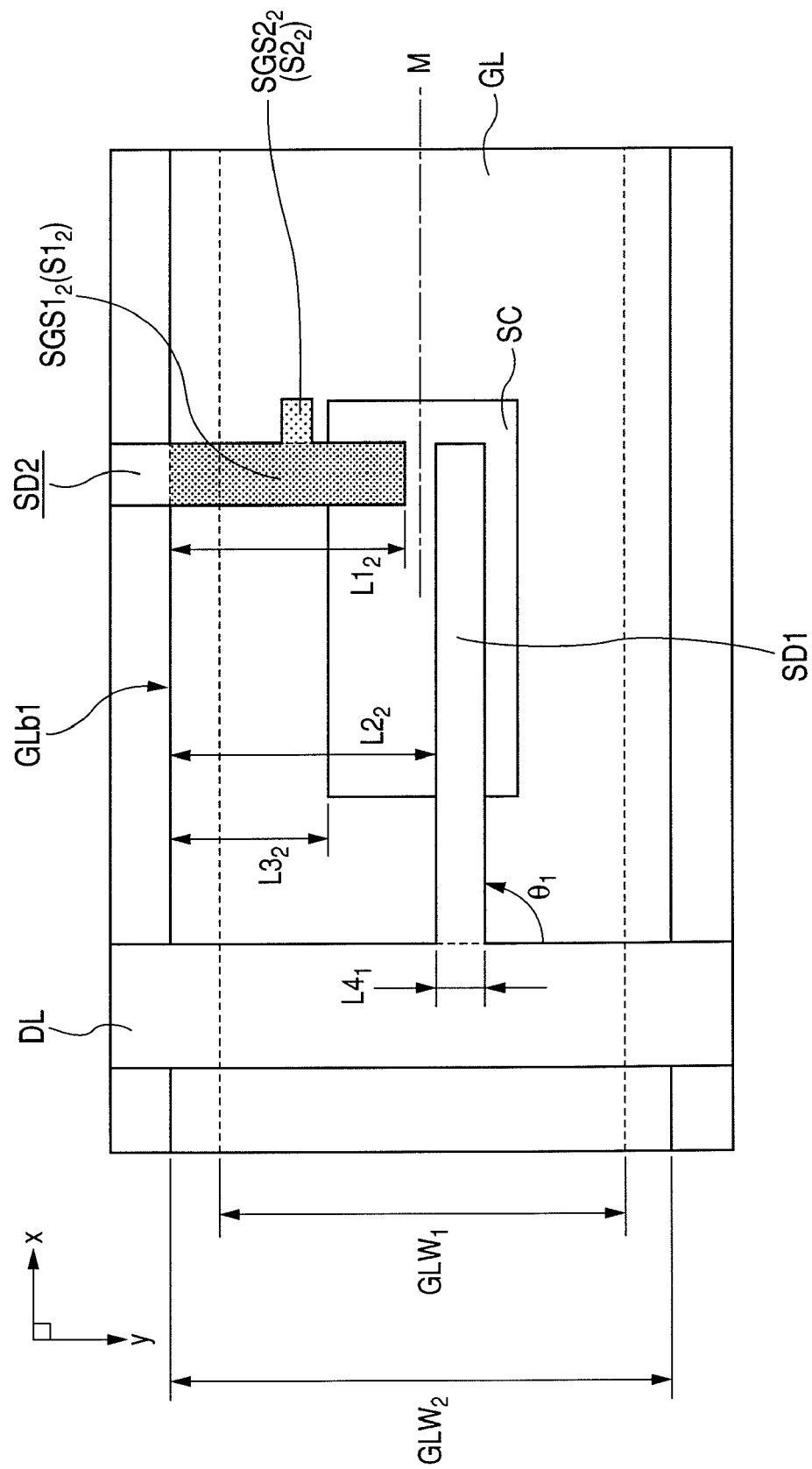

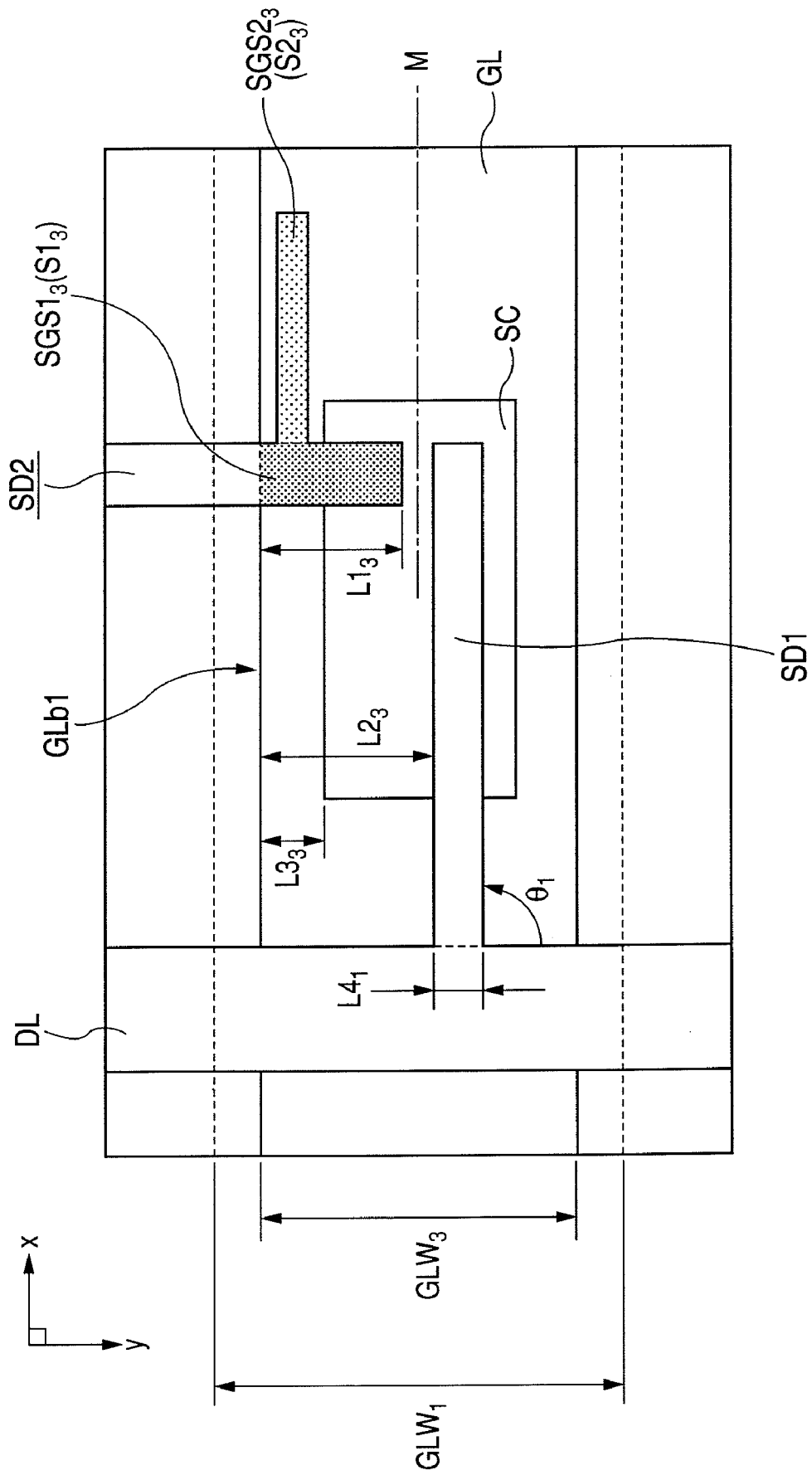

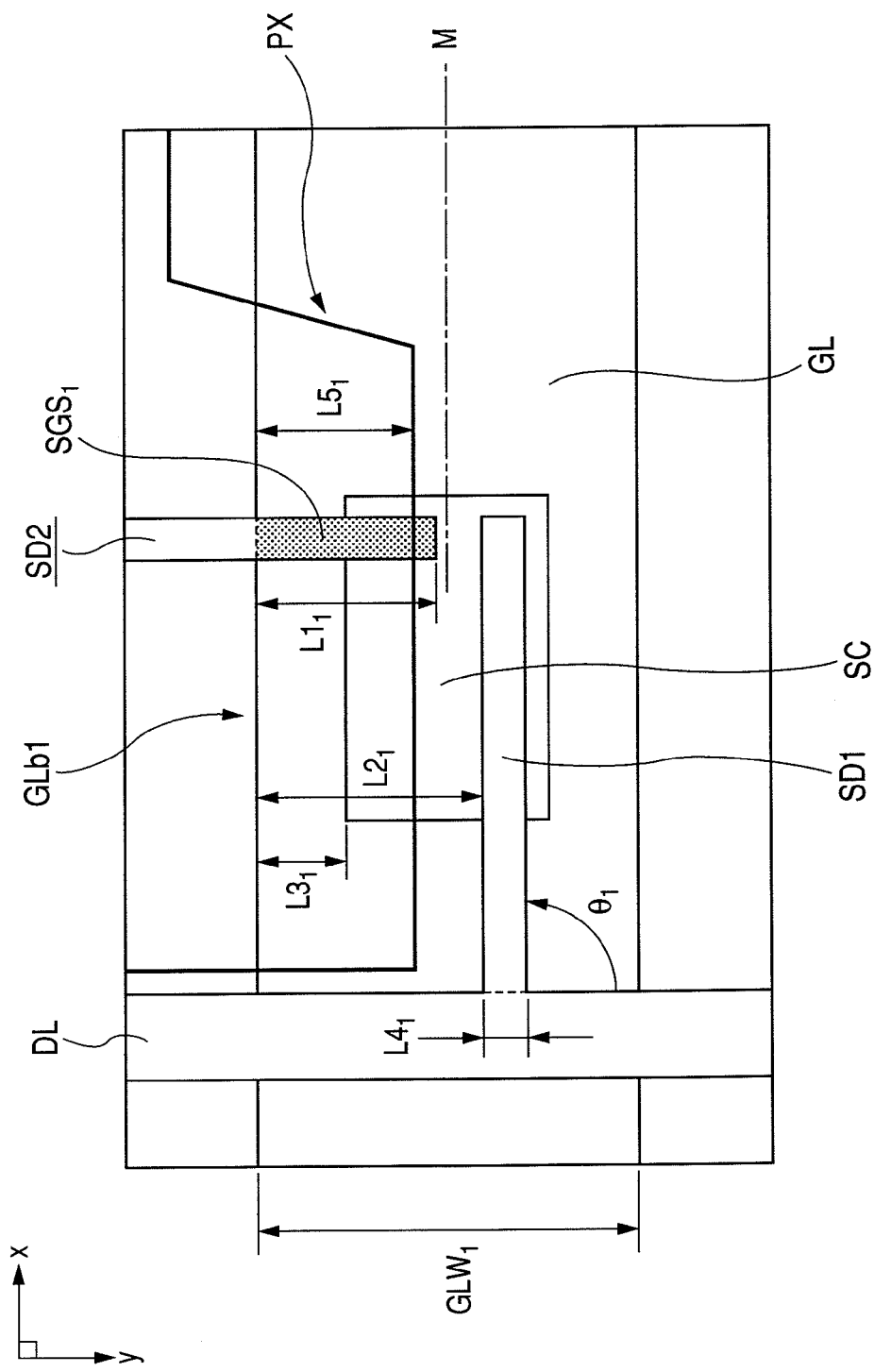

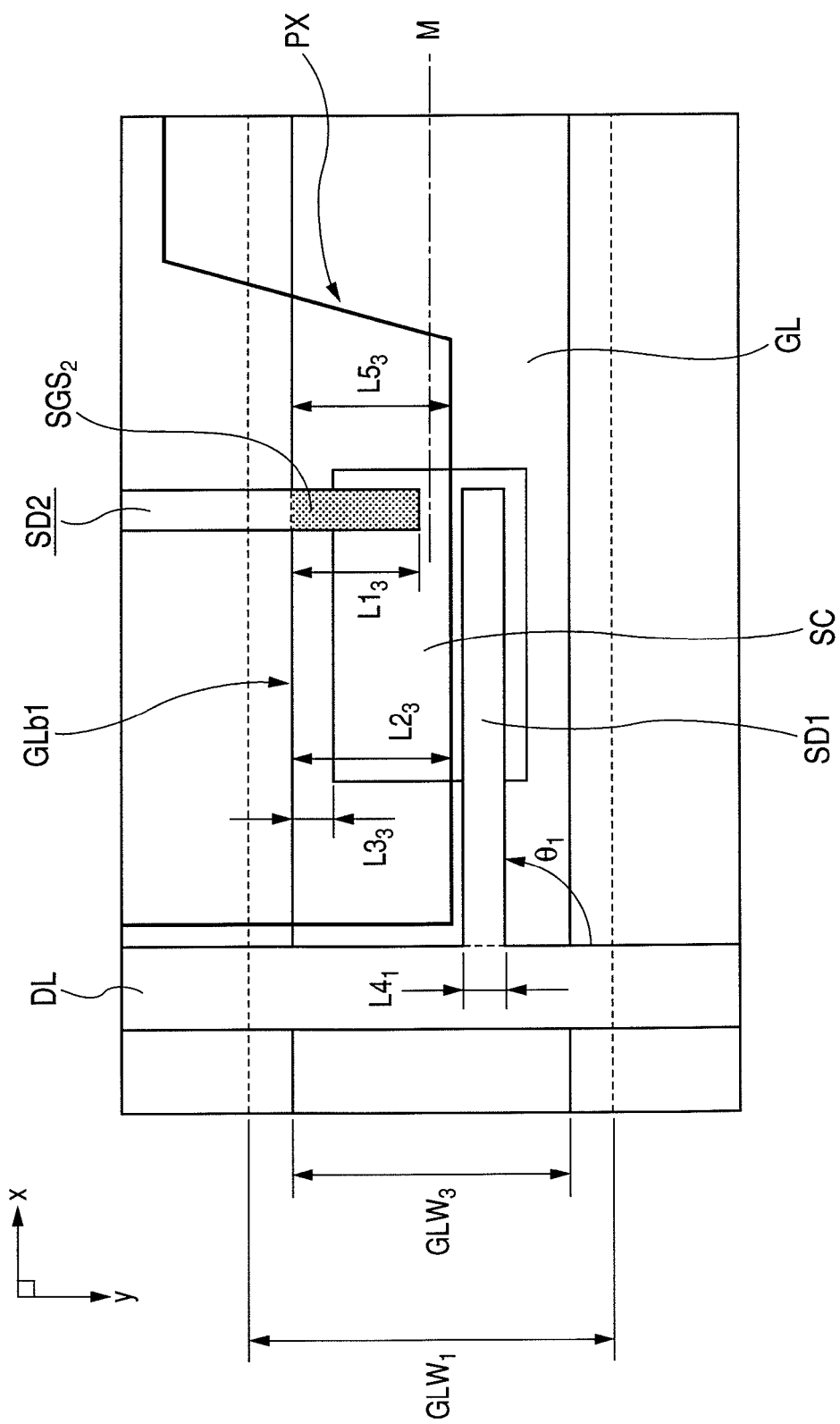

DISPLAY DEVICE AND MANUFACTURING METHOD THEREOF

CLAIM OF PRIORITY

The present application claims priority from Japanese Application JP 2007-008310 filed on Jan. 17, 2007, the content of which is hereby incorporated by reference into this application.

BACKGROUND OF THE INVENTION

The present invention is related to a display device and a manufacturing method thereof, in particular to a technology effectively applied to a TFT (thin film transistor) liquid crystal display device and the manufacturing method of the same.

In the liquid crystal display device, there is an active matrix type liquid crystal display device in which active elements (also referred to as switching elements) are placed as matrix. For the active elements as described above TFT of MIS structure (including MOS structure) is used.

The active elements (TFT) in the active matrix type liquid crystal display device may have for example a semiconductor layer on the scan signal lines with a first insulation layer (gate insulation film) interposed therebetween. The drain region of the semiconductor layer in such a case may be connected to a drain electrode, which is branched from a video signal line. The source region of the semiconductor layer is connected to a source electrode, which may be formed at the same time as the video signal line. The source electrode is connected to a pixel electrode, which is formed on a second insulation layer, via a through hole.

The display area of the liquid crystal display device is formed of plural pixels, and the TFT and the pixel electrode are placed on each pixel.

One important thing when manufacturing the liquid crystal display device is for example to make uniform display characteristics of each pixel which compose one display area in one liquid crystal display panel.

When manufacturing a substrate used for the liquid crystal display panel to form the TFT thereon (referred to as a TFT substrate herein below), in general, scan signal lines, video signal lines, TFTs, pixel electrodes, etc. are formed on each of plural regions of one large plane glass substrate (mother glass), then the plural regions are cut out from the mother glass to obtain plural TFT substrates.

When manufacturing a TFT substrate used in a large liquid crystal display device such as a liquid crystal display television set or a personal computer display (monitor), a semiconductor layer, drain electrodes to be connected to the drain region of the semiconductor layer, and source electrodes to be connected to the source region of the semiconductor layer should be formed such that the size of TFT of each pixel which forms one display area on one TFT substrate will be the same size.

When manufacturing a TFT substrate for use in a small liquid crystal display device such as the display used in a cellular phone terminal or in a PDA, for plural TFT substrates obtained from one mother glass, a semiconductor layer, drain electrodes to be connected to the drain region of the semiconductor layer, and source electrodes to be connected to the source region of the semiconductor layer should be formed such that the size of TFT elements formed on the display area of each TFT substrate will be the same size.

SUMMARY OF THE INVENTION

However, in the manufacturing method of the TFT substrate in the prior art, for example, there may be a considerable variation in the wiring capacity (parasitic capacity) generated between a source electrode and a scan signal line in a TFT of each pixel, often causing some difference in the amplitude of effective voltage applied to the liquid crystal layer of each pixel. This may cause a problem of unequal brightness (uneven image quality) within one display area in the large liquid crystal display device. This may also cause a problem of difference of image quality between two liquid crystal display devices in the small size liquid crystal display device.

In the conventional liquid crystal display device, there has been proposed a workaround to the problems as have been described above by for example widening the width of the scan signal lines so as to enlarge the auxiliary capacity between the scan signal lines and the pixel electrode. However, when widening the width of scan signal lines, another problem of the decreased number of aperture may arise.

Thus the object of the present invention is to provide for example a technology which allows effectively decreasing the uneven image quality in the liquid crystal display device.

Another object of the present invention is to provide for example a technology which allows effectively decreasing the uneven image quality without decreasing the number of aperture in the liquid crystal display device.

The above and further objects and novel features of the present invention will more fully appear from following detailed description when the same is read in connection with the accompanying drawings.

The overview of the representative invention disclosed in this application will be as follows:

(1) A display device having a display panel including plural scan signal lines, plural video signal lines which sterically intersect the plural scan signal lines, plural TFTs placed in a matrix structure, and plural pixel electrodes, wherein the TFTs have a scan signal line, a semiconductor layer disposed on a region overlapping with the scan signal line through an insulation layer when viewing in plan view from the top, a drain electrode branched from video signal lines to be connected to a drain region of the semiconductor layer, and a source electrode to be connected to a source region of the semiconductor layer and to a pixel electrode;

wherein when the width of the scan signal line in the region to place one TFT of the plural TFTs is different from the width of the scan signal line in the region to place another TFT of the plural TFTs which is different from the one TFT;

the channel width and the channel length in the one TFT is almost equal to the channel width and the channel length in the another TFT; and the surface area of the overlap region of the source electrode of the one TFT with the scan signal line when viewing in plan view from the top is almost equal to the surface area of the overlap region of the source electrode of the another TFT with the scan signal line when viewing in plan view from the top.

(2) The display device set forth in (1), wherein the plan size of the overlap region of the source electrode of the one TFT overlapping with the scan signal line is almost equal to the plan size of the overlap region of the source electrode of the another TFT overlapping with the scan signal line;

the extending direction of the part connecting the contact area of the drain electrode of the one TFT to the drain region with the scan signal line is different from the extending direction of the part connecting the contact area of the drain electrode of the another TFT to the drain area with the scan signal line.

(3) The display device set forth in (1), wherein the source electrode is overlapped with the scan signal line when viewing in plan view from the top between the part contacting to the source region of the semiconductor layer and the part contacting to the pixel electrode, and has a part branched from the extending direction of the source electrode connecting the part contacting to the source region of the semiconductor layer with the part contacting to the pixel electrode;

the surface area of the branched part of the source electrode of the one TFT overlapping with the scan signal line when viewing in plan view from the top is different from the surface area of the branched part of the source electrode of the another TFT overlapping with the scan signal line when viewing in plan view from the top;

and the surface area of the entire area of the source electrode of the one TFT overlapping with the scan signal line when viewing in plan view from the top is almost equal to the surface area of the entire area of the source electrode of the another TFT overlapping with the scan signal line.

(4) A display device including a display panel having plural scan signal lines, plural video signal lines sterically intersecting with the plural scan signal lines, plural TFTs placed in a matrix structure, and plural pixel electrodes, wherein the TFT has a scan signal line, a semiconductor layer placed on an insulation layer and overlapping with the scan signal line when viewing in plan view from the top, a drain electrode branched from a video signal line to be connected to the drain region of the semiconductor layer, and a source electrode to be connected to the source region of the semiconductor layer and the pixel electrode;

the pixel electrode has a part overlapping with the scan signal line when viewing in plan view from the top, to which connected is the gate of the TFT having the source electrode connected to the pixel electrode;

when the width of the scan signal line in the region to place one TFT among the plural TFTs is different from the width of the scan signal line in the region to place another TFT different from the one TFT, the source area of the overlap region of the pixel electrode to be connected to the source electrode of the one TFT overlapping with the scan signal line when viewing in plan view from the top is different from the surface area of the overlap region of the pixel electrode to be connected to the source electrode of the another TFT overlapping with the pixel electrode when viewing in plan view from the top.

(5) A display device set forth in (4), wherein the sum of the wiring capacitance generated between the source electrode of the one TFT and the scan signal line and the wiring capacitance generated between the pixel electrode to be connected to the source electrode and the scan signal line is almost equal to the sum of the wiring capacitance generated between the source electrode of the another TFT and the scan signal line and the wiring capacitance generated between the pixel electrode to be connected to the source electrode and the scan signal line.

(6) A display device set forth in the (4) or (5), wherein the source electrode and the pixel electrode of the TFT are connected to the scan signal line in the overlap region overlapping with the scan signal line when viewing in plan view from the top.

(7) A display device set forth in any one of the (1) to (6), wherein the display panel is a liquid crystal display panel having liquid crystal encapsulated between two substrates.

(8) A manufacturing method of a display device, for forming on a surface of an insulation substrate, plural scan signal lines, plural video signal lines which sterically intersect with the plural scan signal lines, plural TFTs which are placed in a matrix structure, and plural pixel electrodes, the method including the process steps of first process step of forming the plural scan signal lines;

second process step of measuring the width of the plural scan signal lines formed in the first process step in the vicinity of the region in which the plural TFTs are placed;

third process step of determining the position of forming the semiconductor layer of the TFT, the size and the position of forming the drain electrode to be connected to the drain region of the semiconductor layer of the TFT, and the size and the position of forming the source electrode to be connected to the source region of the semiconductor layer of the TFT, based on the measurement result of the second process step;

fourth process step of forming a first insulation layer after the second process step;

fifth process step of forming the semiconductor layer of the TFT at the position determined in the third process step, after the fourth process step;

sixth process step of forming the video signal line and the drain electrode and the source electrode of the size determined in the third process step at the position determined in the third process step, after the fifth process step;

seventh process step of forming a second insulation layer after the sixth process step; and eighth process step of forming the pixel electrode to be connected to the source electrode, after the seventh process step;

wherein the third process step determines the size and forming position of the drain electrode and the source electrode, without regard of the width of the scan signal line, such that the surface area of the overlap region of the source electrode of each TFT overlapping with the scan signal line is equally formed, and such that the channel width and the channel length of each TFT are equally formed.

(9) A manufacturing method of a display device, for forming on a surface of an insulation substrate, plural scan signal lines, plural video signal lines which sterically intersect with the plural scan signal lines, plural TFTs which are placed in a matrix structure, and plural pixel electrodes, the method including the process steps of first process step of forming the plural scan signal lines;

second process step of forming a first insulation layer after the first process step;

third process step of forming the semiconductor layer of the TFT after the second process step;

fourth process step of measuring the distance from one edge of the scan signal line to the semiconductor layer after the third process step;

fifth process step of determining the plan size of source electrode to be connected to the source region of the semiconductor layer of the TFT, based on the measurement result of the fourth process step;

sixth process step of forming the source electrode of the plan size determined in the fifth process step, and the plural video signal lines, and the drain electrode to be connected to the drain region of the semiconductor layer of the TFT, after the fourth process step and the fifth process step;

seventh process step of forming a second insulation layer after the sixth process step; and eighth process step of forming the pixel electrode to be connected to the source electrode after the seventh process step;

wherein in the fifth process step the plan size of the source electrode is determined by providing a part which overlaps with the scan signal line and is branched from the extending direction of the source electrode connecting the part in contact with the source region of the semiconductor layer with the part connecting to the pixel electrode, between the part in contact with the source region of the scan signal line and the part connecting to the pixel electrode in the each source electrode, so as to narrow the surface area of the branching part when the distance from one edge of the scan signal line to the semiconductor layer is longer, or so as to enlarge the surface area of the branching part when the distance from one edge of the scan signal line to the semiconductor layer is shorter, in order to evenly form the plan surface area of the overlap region overlapping each source electrode with each scan signal line when viewing in plan view from the top.

(10) A manufacturing method of a display device, for forming on a surface of an insulation substrate, plural scan signal lines, plural video signal lines which sterically intersect with the plural scan signal lines, plural TFTs which are placed in a matrix structure, and plural pixel electrodes, the method including the process steps of first pixel electrode of forming the plural scan signal lines;

second process step of forming a first insulation layer;

third process step of forming the semiconductor layer of the TFT after the second process step;

fourth process step of forming a drain electrode to be connected to the drain region of the semiconductor layer of the TFT and to the scan signal line, and a source electrode to be connected to the source region of the semiconductor layer of the TFT, after the third process step;

fifth process step of measuring the surface area of the overlap region of the source electrode overlapping with the scan signal line when viewing in plan view from the top after the fourth process step;

sixth process step of determining the plan size of the overlap region of a pixel electrode to be connected to the source electrode overlapping on the plan with the scan signal line to which the gate of the TFT having the source electrode to be connected to the pixel electrode is connected, based on the measurement result of the fifth process step;

seventh process step of forming a second insulation layer after the fifth process step and the sixth process step; and eighth process step of forming the pixel electrode of the size determined in the sixth process step, after the seventh process step;

wherein the plan size of the pixel electrode is determined in the sixth process step so as to narrow the surface area of the plan overlap region of the pixel electrode to be connected to the source electrode overlapping with the scan signal line when the surface area of the plan overlap region of the source electrode overlapping with the scan signal line is wider, and so as to enlarge the surface area of the plan overlap region of the pixel electrode to be connected to the source electrode overlapping with the scan signal line when the surface area of the plan overlap region of the source electrode overlapping with the scan signal line is narrower.

In accordance with the display device of the present invention and the manufacturing method thereof, the wiring capacitance (parasitic capacitance) generated between a scan signal line and the source electrode of a TFT in each pixel forming one display area may be almost evenly formed to allow decreasing the uneven image quality caused by the difference of the amplitude of the wiring capacitance. In addition the difference between plural display devices manufactured from plural TFT substrates obtained from one single mother glass may also be decreased.

In addition, in accordance with the display device of the present invention and the manufacturing method thereof, the uneven image quality caused by the difference of wiring capacitance between the scan signal line and the source electrode of the TFT may be decreased without decreasing the number of aperture.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention. In the drawings.

FIG. 4A shows a schematic plan view illustrating the basic arrangement of the TFT substrate in accordance with first preferred embodiment of the present invention; FIG. 4B shows a schematic plan view illustrating an exemplary problem which may arise in the TFT substrate of the prior art; FIG. 4E a second feature in the TFT substrate in accordance with the first preferred embodiment of the present invention.

FIG. 8A shows a schematic plan view illustrating the fundamental arrangement of a TFT in accordance with a second preferred embodiment of the present invention; FIG. 8B shows a schematic plan view illustrating first feature of the TFT substrate in accordance with the second preferred embodiment of the present invention; FIG. 8C shows a schematic plan view illustrating second feature of the TFT substrate in accordance with the second preferred embodiment of the present invention.

FIG. 11A shows a schematic plan view illustrating the basic arrangement of the TFT substrate in accordance with the third preferred embodiment; FIG. 11C shows a schematic plan view illustrating second feature of the TFT substrate in accordance with the third preferred embodiment.

DESCRIPTION OF THE PREFERRED EMBODIMENT

The present invention will be described in greater details by some best mode for carrying out the invention (preferred embodiments) embodying the present invention with reference to the accompanying drawings.

It is to be noted here that the similar members are designated to the identical reference numbers and the detailed description of the parts already described in the preceding embodiment will be omitted.

First Embodiment

Figure 1A:
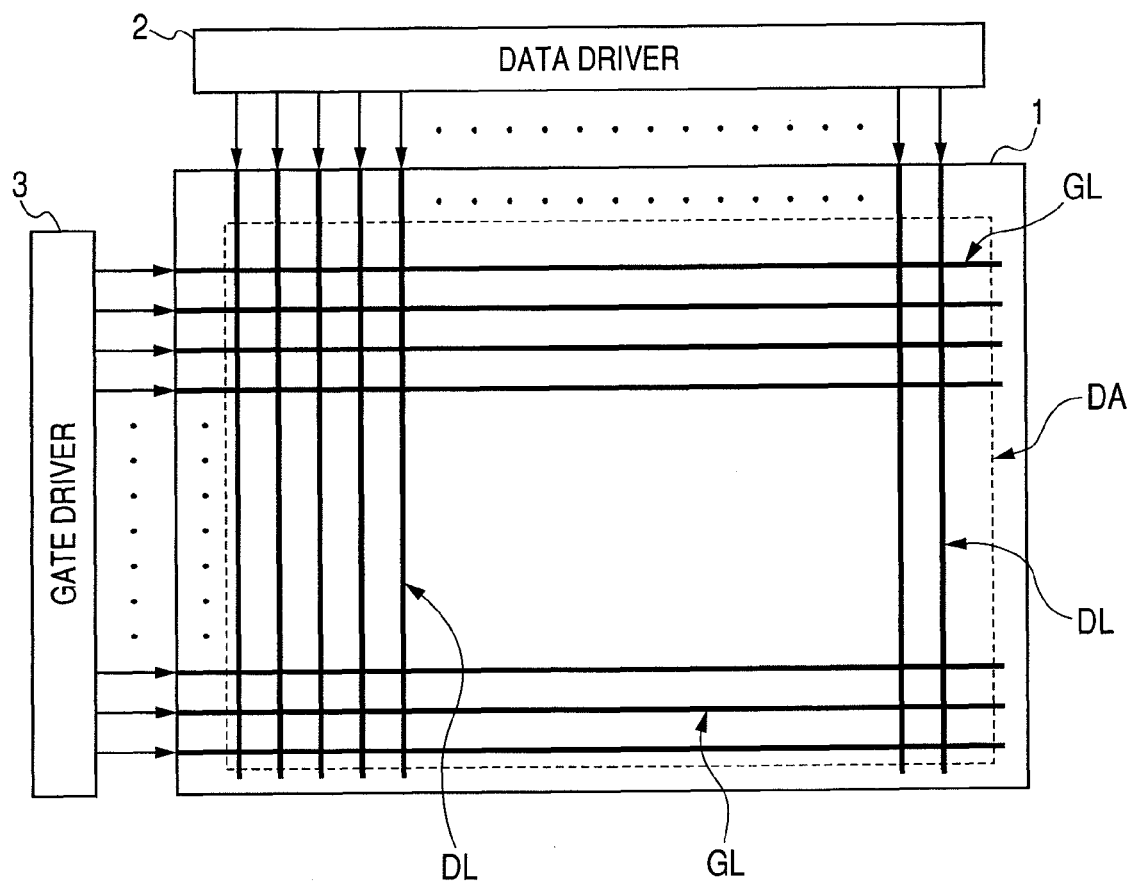
FIG. 1A shows a schematic diagram illustrating a typical example of the arrangement of a liquid crystal display device in accordance with the present invention.
Figure 1B:
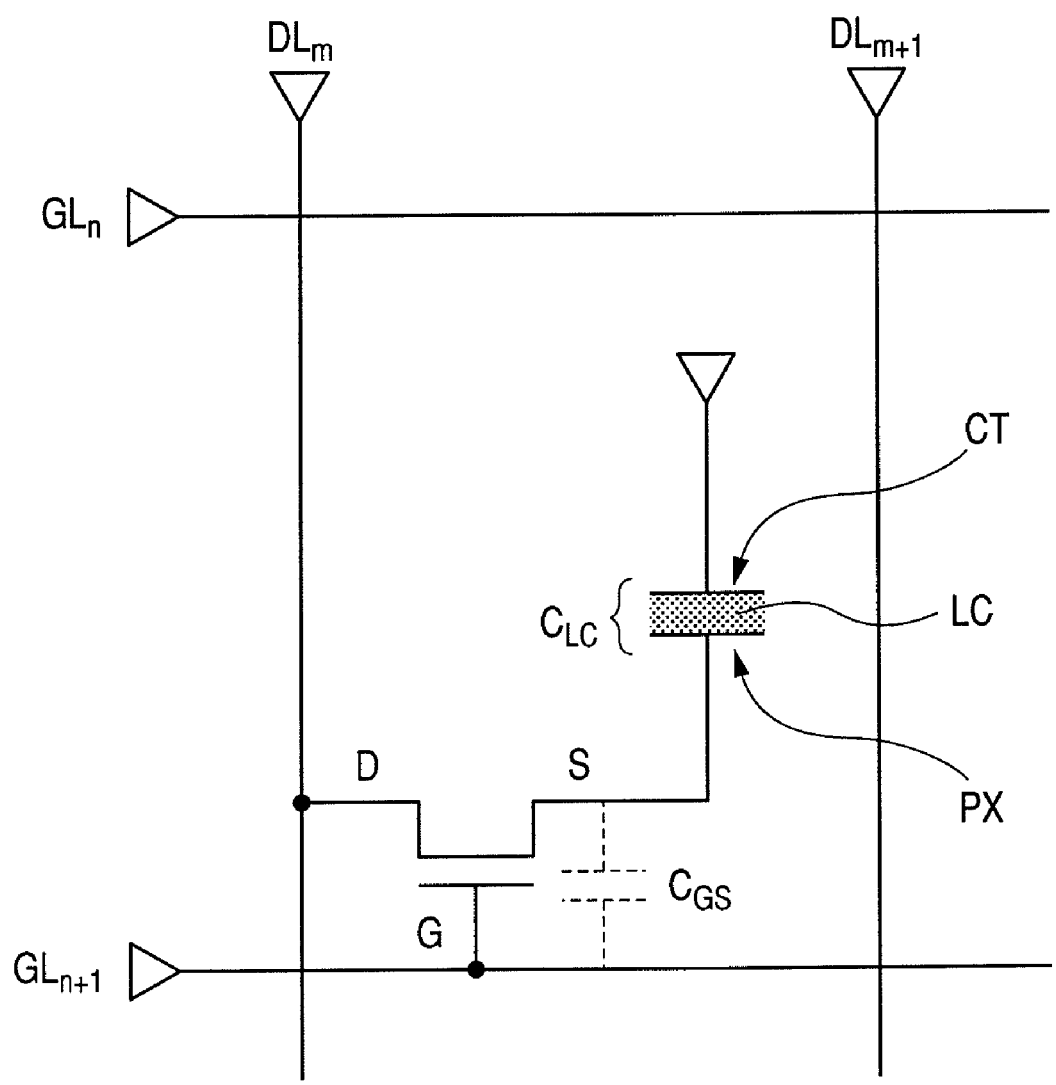
FIG. 1B shows a schematic circuit diagram illustrating the circuit of one pixel in the liquid crystal display panel shown in FIG. 1A.

Now referring to FIGS. 1A and 1B, FIG. 1A shows a schematic diagram illustrating a typical example of the arrangement of a liquid crystal display device in accordance with the present invention. FIG. 1B shows a schematic circuit diagram illustrating the circuit of one pixel in the liquid crystal display panel shown in FIG. 1A.

The present invention may be applied to a TFT liquid crystal display device of the active matrix type. The active matrix TFT liquid crystal display device has for example a liquid crystal display panel 1, a data driver 2, and a gate driver 3, as shown in FIG. 1A. As is not shown in FIG. 1A, the TFT liquid crystal display device further includes for example a controller circuit for controlling the operation of the data driver 2 and the gate driver 3. The transmissive and semi-transmissive TFT liquid crystal display device has also a backlight unit (light source) as well.

The liquid crystal display panel 1 has plural scan signal lines GL and plural video signal lines DL, as well as a number of active elements (also referred to as switching elements) placed in the display area DA in a matrix structure. The scan signal lines GL and the video signal lines DL are respectively formed on the opposing sides of a sandwiched insulation layer. One video signal line DL is sterically intersects with plural scan signal lines GL with the interposed insulation layer. Further, in the liquid crystal display panel 1, the active elements are TFT of MIS structure (including MOS structure).

The display area DA of the liquid crystal display panel 1 is composed of a number of pixels placed in the extending direction of the scan signal lines GL and in the extending direction of the video signal lines DL, the area occupied by one pixel corresponds to a area surrounded by two adjoining scan signal lines GL and two apposed adjoining video signal lines DL.

When one TFT used as the active element is placed for one pixel, as shown in FIG. 1B, For the TFT placed in the area (pixel) surrounded by two adjacent scan signal lines $GL_n$, $GL_{n+1}$ (where n is an integer larger than 1) and by two adjacent video signal lines $DL_m$, $DL_{m+1}$ (where m is an integer larger than 1) the gate (G) is connected to the scan signal lines $GL_{n+1}$, and the drain is connected to the video signal lines $DL_m$. In this case the source (S) of the TFT is connected to the pixel electrode PX. The pixel electrode PX forms a pixel capacitance CLC (may also be referred to as a liquid crystal capacitance) with the opposing electrode CT (also referred to as a common electrode) and the liquid crystal LC.

In a liquid crystal display panel having the arrangement as shown inn FIG. 1B, there also is a wiring capacitance (parasitic capacitance) $C_{GS}$ between the source (S) of the TFT and the scan signal lines GLn+1, in addition to the pixel capacitance CLC.

In the present description, for the drain (D) and the source (S) of a TFT, the one which is connected to the video signal line DL is designated to as drain (D), and the one which is connected to the pixel electrode PX is designated to as source (S). However there may be cases where the designation may be vice versa, more specifically the one which is connected to the video signal line DL may be designated to as source (S) and the one which is connected to the pixel electrode PX is designated to as drain (D).

Figure 2A:
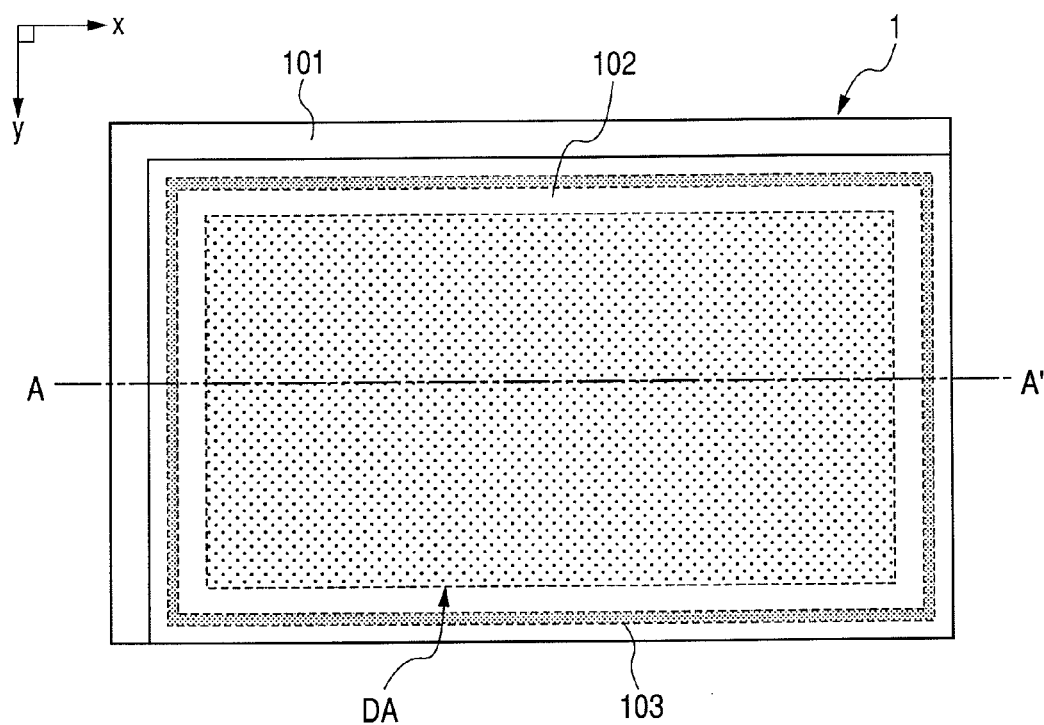
FIG. 2A shows a schematic plan view illustrating an exemplary arrangement of a liquid crystal display panel.
Figure 2B:
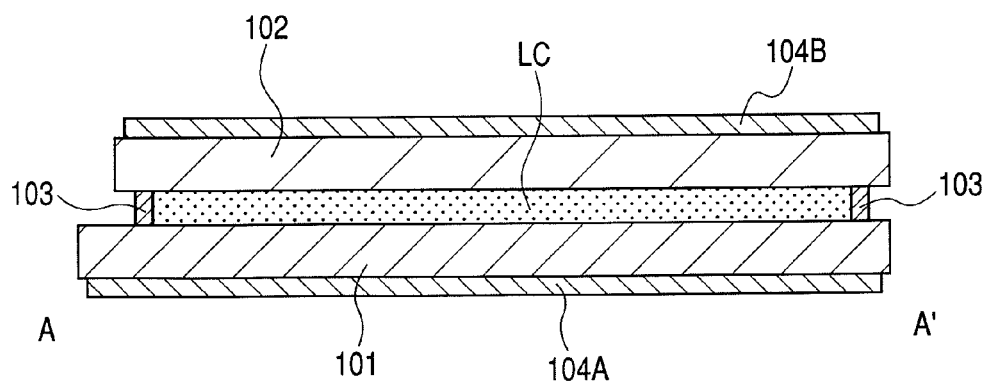
FIG. 2B shows a schematic cross-sectional view taken along with the line A-A' of FIG. 2A.

Now referring to FIGS. 2A and 2B, FIG. 2A shows a schematic plan view illustrating an exemplary arrangement of a liquid crystal display panel. FIG. 2B shows a schematic cross-sectional view taken along with the line A-A' of FIG. 2A.

Figure 3A:
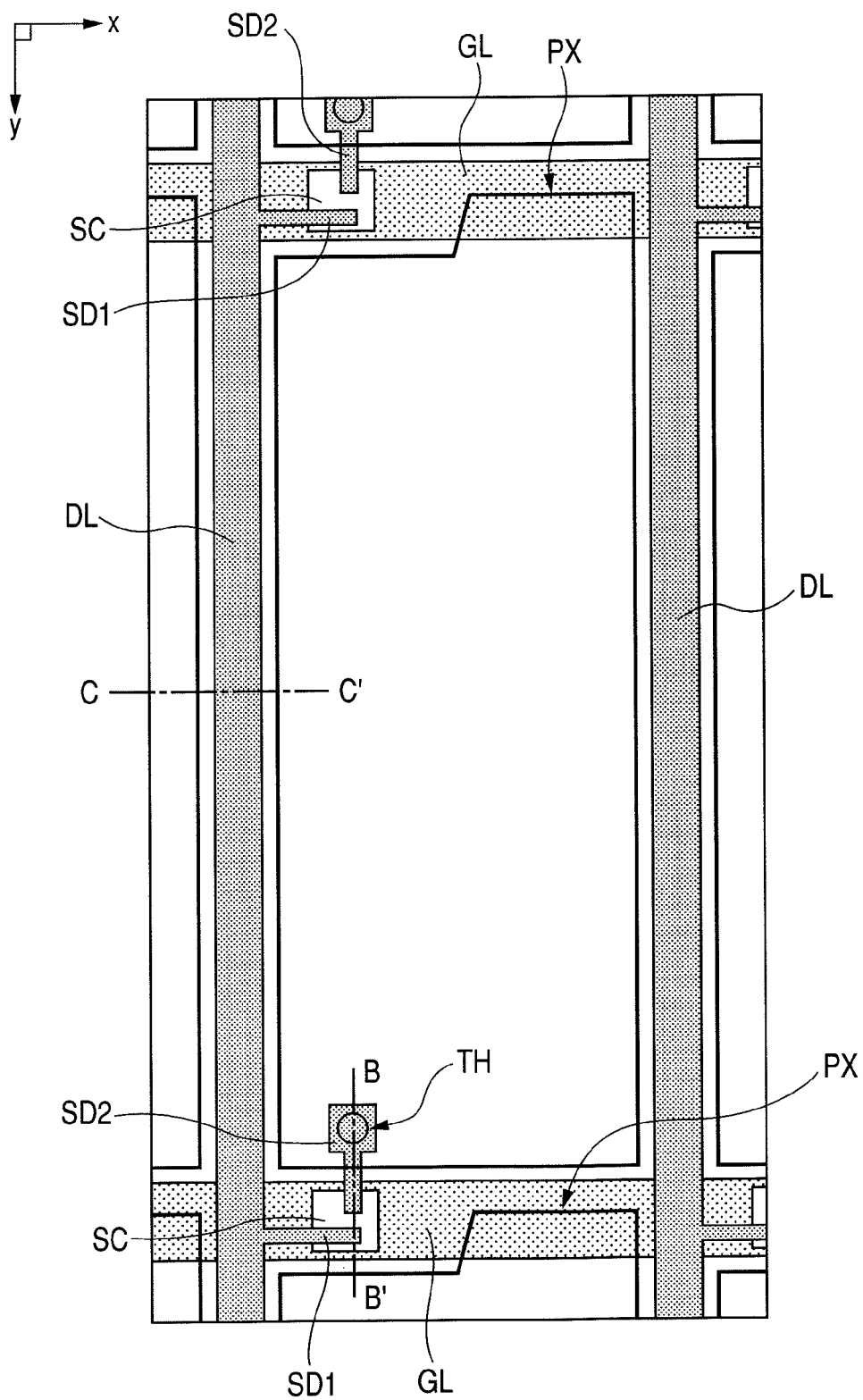
FIG. 3A shows a schematic plan view illustrating an exemplary arrangement of one pixel in a TFT substrate of the liquid crystal display panel.
Figure 3B:
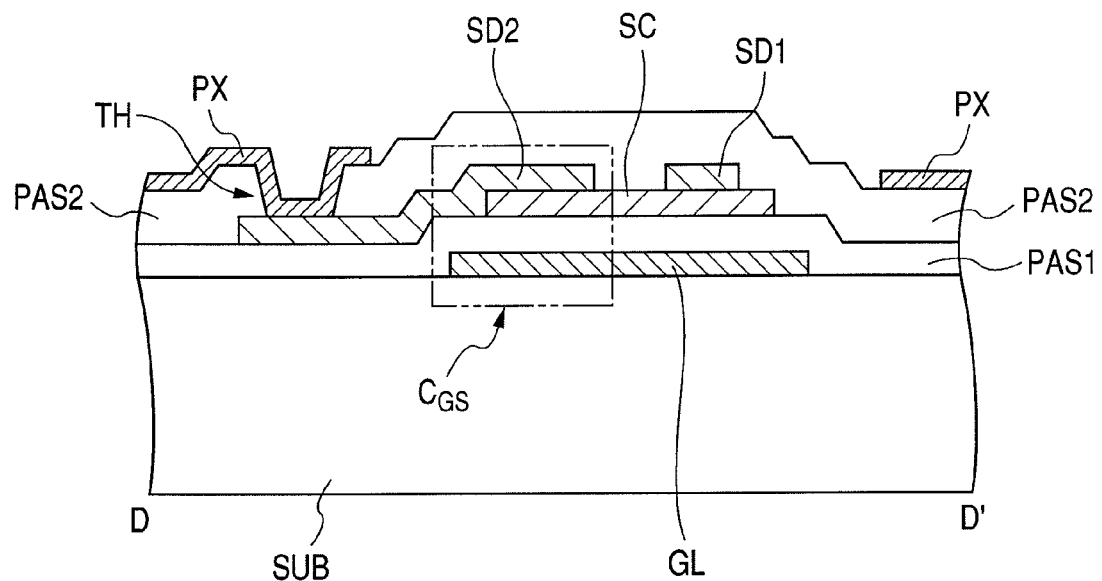
FIG. 3B shows a schematic cross-sectional view taken along with the line B-B' of FIG. 3A.
Figure 3C:
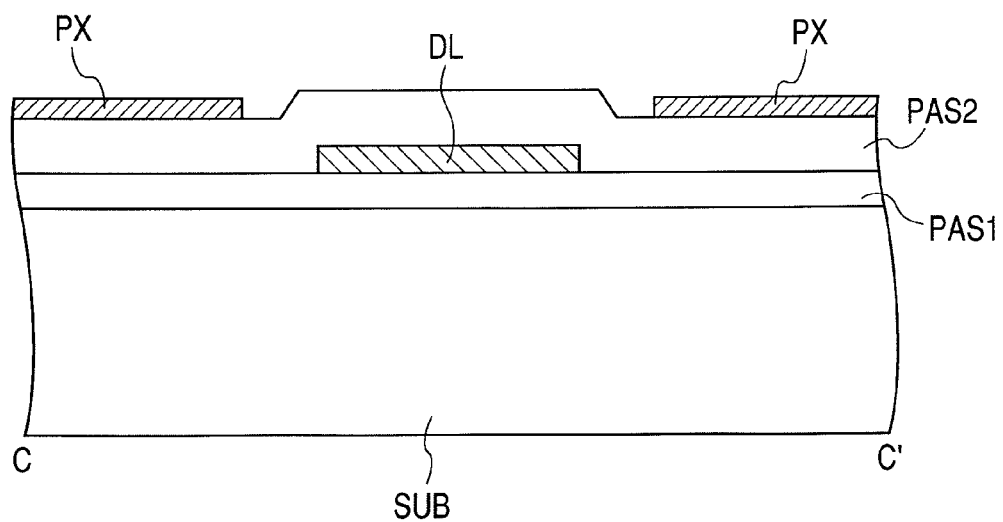
FIG. 3C shows a schematic cross-sectional view taken along with the line C-C' of FIG. 3A.

Now referring to FIGS. 3A to 3C, FIG. 3A shows a schematic plan view illustrating an exemplary arrangement of one pixel in a TFT substrate of the liquid crystal display panel. FIG. 3B shows a schematic cross-sectional view taken along with the line B-B' of FIG. 3A. FIG. 3C is a schematic cross-sectional view taken along with the line C-C' of FIG. 3A.

As shown in FIG. 2A and FIG. 2B, the liquid crystal display panel 1 has the liquid crystal LC encapsulated between a pair of substrates, which are referred to as TFT substrate 101 and opposing substrate 102. The TFT substrate 101 and the opposing substrate 102 are sealed by a sealer 103 of annular form, which surrounds around the display area DA. The liquid crystal LC is encapsulated in the space surrounded by the TFT substrate 101, the opposing substrate 102, and the sealer 103.

When the liquid crystal display panel 1 is of transmissive type or semi-transmissive type, the outwardly facing sides of the TFT substrate 101 and the opposing substrate 102 may have a pair of polarization plates 104A and 104B. There may also be one or more of layers of retarder plates between the TFT substrate 101 and the polarization plate 104A and between the opposing substrate 102 and the polarization plate 104B.

When the liquid crystal display panel 1 is of reflective type, in general the polarization plate 104A and retarder plate of the TFT substrate 101 side will not be required.

When the liquid crystal display panel 1 is of transmissive type and the liquid crystal display panel 1 is of the vertical electric field driving type such as TN type or VA type, the scan signal lines GL, the video signal lines DL, the TFTs used as active elements, pixel electrodes PX among the arrangement shown in FIG. 1A and FIG. 1B are formed on the TFT substrate 101.

In such a case the arrangement of one pixel in the TFT substrate 101 will be as shown in FIG. 3A to FIG. 3C, there are stacked on a surface of an insulation substrate SUB such as glass substrate the scan signal lines GL, a first insulation layer PAS1, a semiconductor layer SC, the video signal lines DL, drain electrodes SD1, source electrodes SD2, a second insulation layer PAS2, and pixel electrodes PX. The pixel electrode PX is connected to the source electrode SD2 via a through hole TH.

The scan signal lines GL are a conductive layer formed by etching a first conductive film made of a metal such as aluminum for example.

On the scan signal lines GL, the semiconductor layer SC formed on the first insulation layer PAS1 is a semiconductor layer formed by etching a semiconductor film made of such as amorphous silicone, which is served as the semiconductor layer of the TFT. In such a case the semiconductor layer SC has three regions, namely the drain region, the source region, and the channel region. The first insulation layer PAS1 is an insulation layer formed of a silicone oxide film, which is served as the gate insulator film of the TFT.

The video signal lines DL, the drain electrodes SD1, and source electrodes SD2 are conductive layers formed by etching a second conductive film made of such as aluminum. In such a case the drain electrodes SD1 are integratedly formed along with the video signal lines DL. Also in this case the source electrodes SD2 extend in the extending direction (y direction) of the video signal lines DL, and have the regions overlapping with the scan signal lines GL in the plan view, and the regions not overlapping. A wiring capacitance $C_{GS}$ is formed in the region of the source electrode SD2 overlapping with the scan signal line GL in the plan view.

The plan is the plain surface shown in FIG. 3A, more specifically is the plain surface of the TFT substrate 101 (the liquid crystal display panel 1) when viewing in plan view from the standpoint of an observer. Any other plans in the present specification are also the plain surfaces shown in FIG. 3A, namely the plain surfaces when viewing the TFT substrate 101 (liquid crystal display panel 1) from the standpoint of an observer.

The pixel electrodes PX, which are formed on the second insulation layer PAS2 on the plane having video signal lines DL formed thereon, may be a conductive layer formed by etching a third conductive film made of conductive material having a high optical transmissivity such as ITO. The pixel electrode PX is connected to the source electrodes SD2 via the through holes TH. The pixel electrode PX has an overlap part overlapping with the scan signal lines GL which are not connected with the gates of the TFTs having the source electrodes SD2 connected to the pixel electrode PX, among two apposed adjacent scan signal lines GL, in the plan view. The region of pixel electrode PX overlapping with the scan signal lines GL in the plan view will have the sustaining capacity (may also be referred to as auxiliary capacity) formed therebetween.

Although omitted in FIG. 3B and FIG. 3C, an oriented film is formed for example on the surface on which the pixel electrode PX is formed, and the surface on which the oriented film is formed of the TFT substrate 101 is opposed to the opposing substrate 102 with the liquid crystal LC interposed therebetween.

Although detailed description will not be given, in the opposing substrate 102, there are formed for example a shield film for splitting the display area DA into a number of regions for each pixel, a color filter, an opposing electrode CT, and an oriented film on the surface of the insulation substrate such as glass substrate.

In the following description the features will be described when the present invention is applied to the TFT substrate 101 having the arrangement of one pixel in the display area DA as shown in FIG. 3A to FIG. 3C.

Figure 4C:
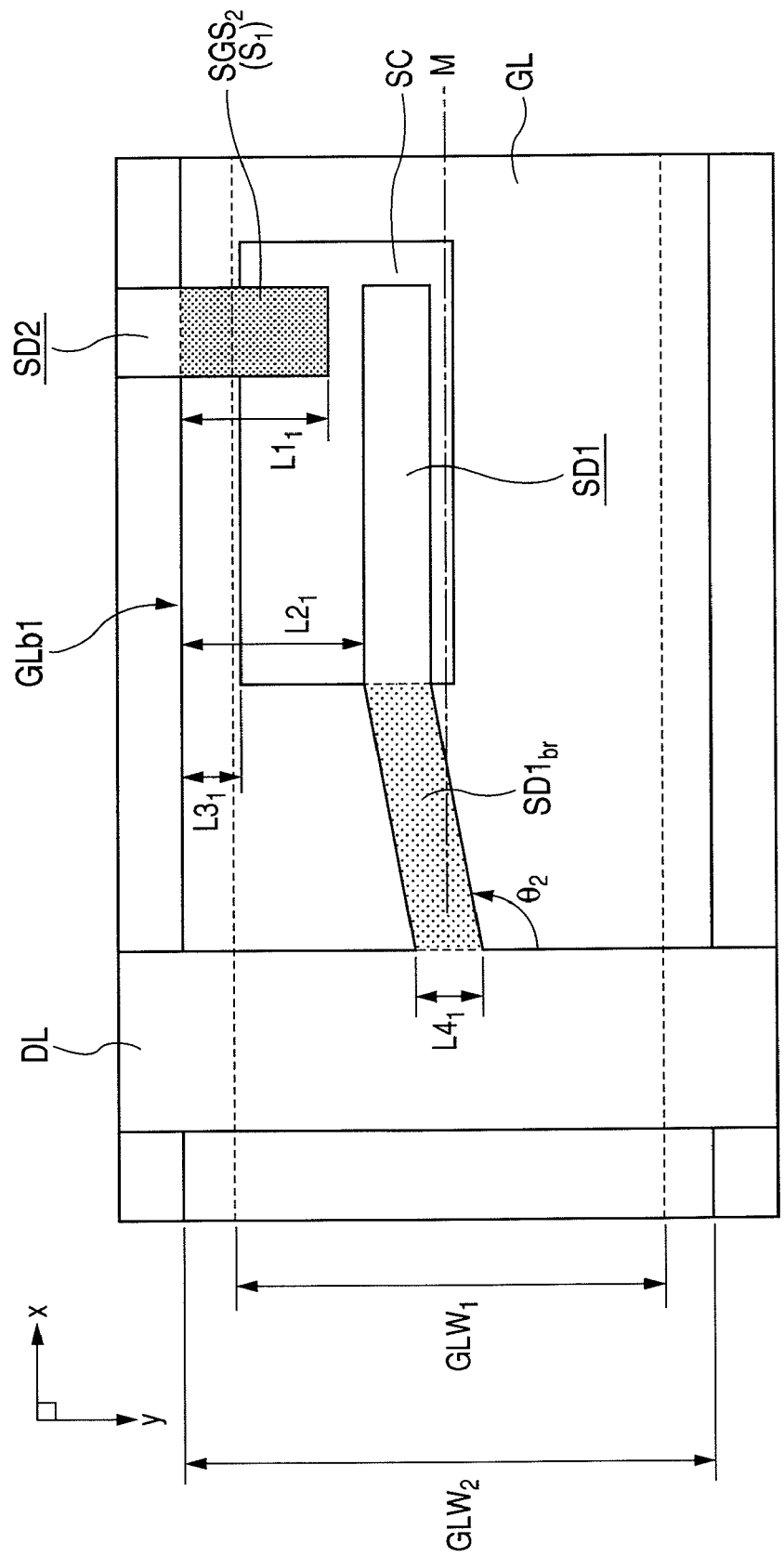
FIG. 4C shows a schematic plan view illustrating first feature in the TFT substrate in accordance with the first preferred embodiment of the present invention.
Figure 4D:
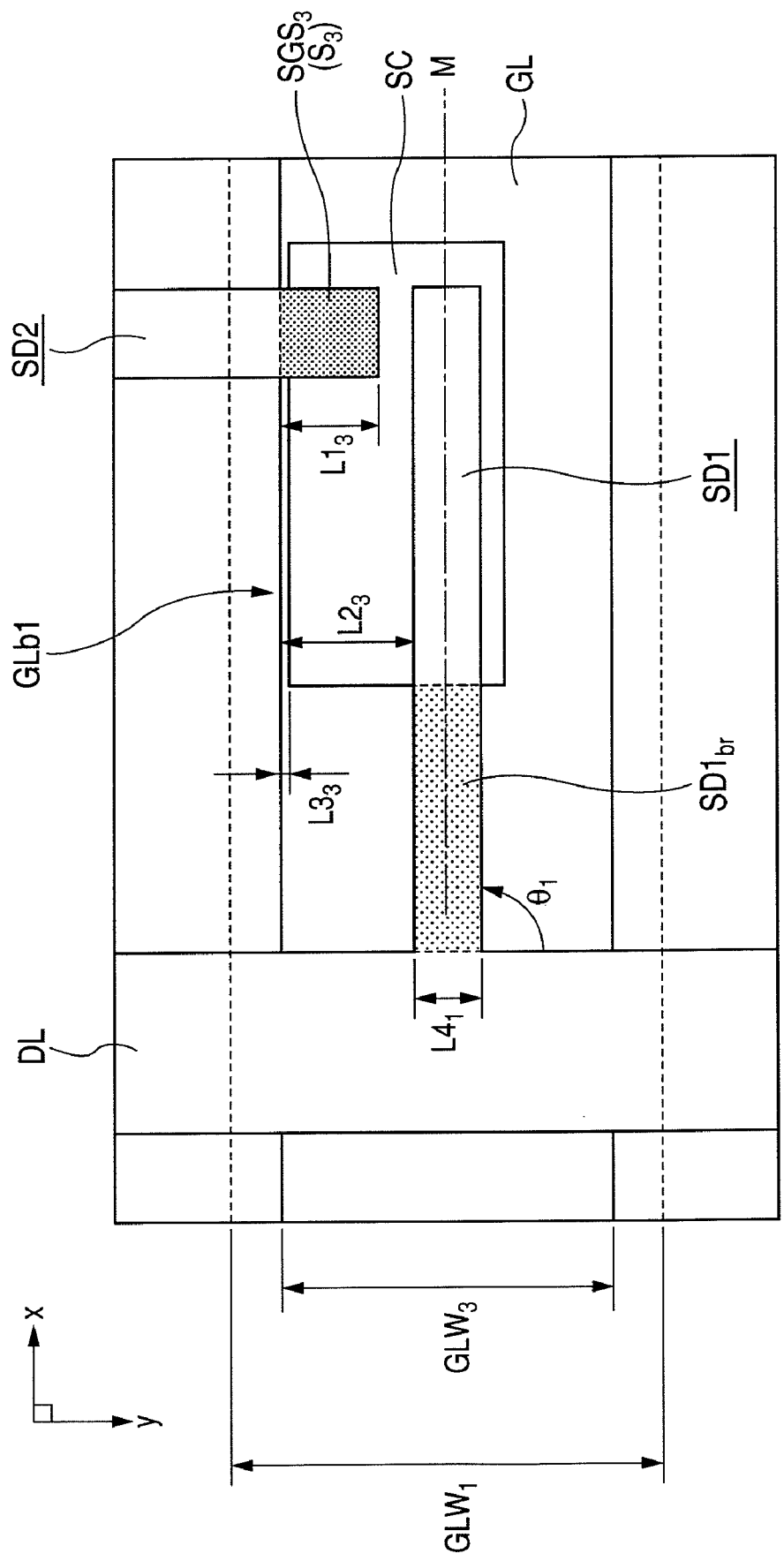
FIG. 4D shows a schematic plan view illustrating another exemplary problem which may arise in the TFT substrate of the prior art.
Figure 4F:
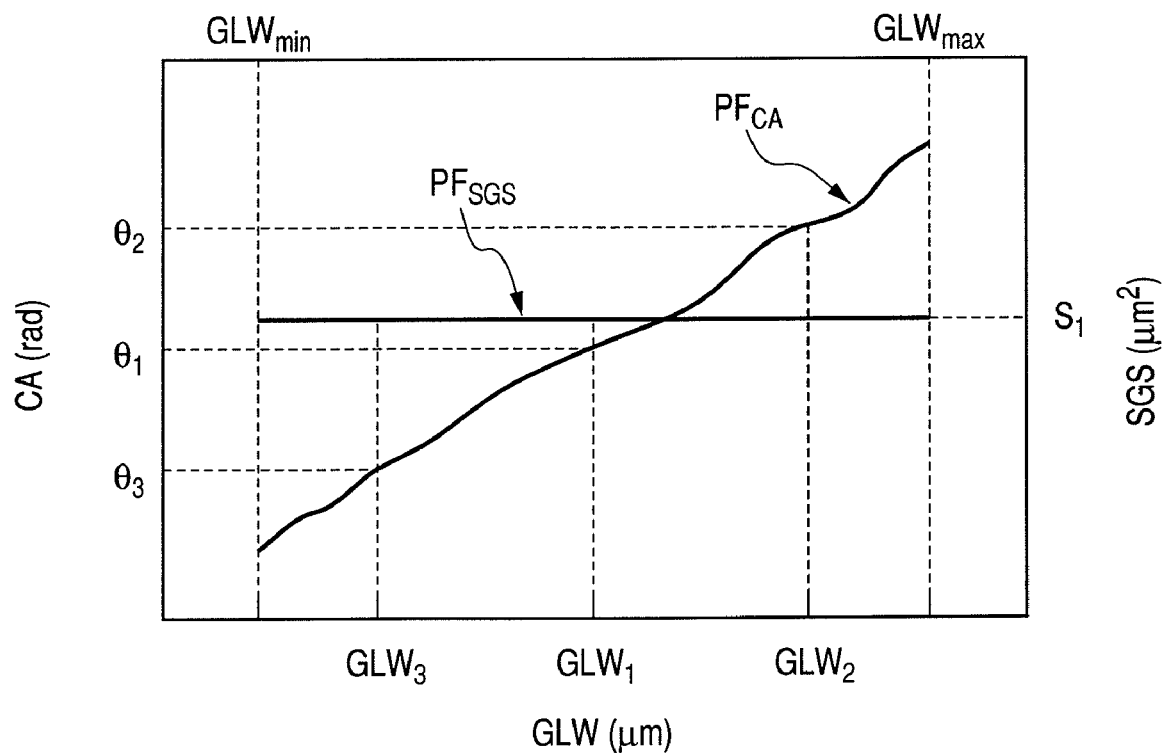
FIG. 4F shows a schematic diagram illustrating the relationship between the width of scan signal line and the connecting angle of the drain electrode in the TFT substrate in accordance with first preferred embodiment of the present invention.

Now referring to FIGS. 4A to 4F, FIG. 4A shows a schematic plan view illustrating the basic arrangement of the TFT substrate in accordance with first preferred embodiment of the present invention. FIG. 4B shows a schematic plan view illustrating an exemplary problem which may arise in the TFT substrate of the prior art. FIG. 4C shows a schematic plan view illustrating first feature in the TFT substrate in accordance with the first preferred embodiment of the present invention. FIG. 4D shows a schematic plan view illustrating another exemplary problem which may arise in the TFT substrate of the prior art. FIG. 4E shows a second feature in the TFT substrate in accordance with the first preferred embodiment of the present invention. FIG. 4F shows a schematic diagram illustrating the relationship between the width of scan signal line and the connecting angle of the drain electrode in the TFT substrate in accordance with first preferred embodiment of the present invention.

For each TFT of the TFT substrate 101 in the first embodiment, as shown in FIG. 4A, a semiconductor layer SC, a drain electrode SD1 connected to the drain region of the semiconductor layer SC, a source electrode SD2 connected to the source region of the semiconductor layer SC may be formed on the region overlapping with the scan signal line GL having the width (dimension in y direction) of GLW1 in the plan view. The scan signal line GL, the semiconductor layer SC, the drain electrode SD1, and the source electrode SD2 are formed based on the layout data previously prepared. If each TFT is formed as described in the layout data of the designing stage, the distance $L1_1$ from one edge GLb1 of the scan signal line GL opposing to the pixel electrode PX connected to the source electrode SD2 to the edge of the source electrode SD2 opposing to the drain electrode SD1 will be almost the same value, in each region in which a TFT is formed. In a similar fashion, the distance $L2_1$ from the end GLb1 of the scan signal line GL to the edge of the drain electrode SD1 opposing to the source electrode SD2, as well as the distance $L3_1$ from the edge GLb1 of the scan signal line GL to the edge of the semiconductor layer SC in each region in which the TFT is formed, will be almost the same value.

If each TFT is formed as is in the layout data of the designing stage, the surface area SGS1 of overlap region in plan view of the source electrode SD2 overlapping with the scan signal line GL in each region in which the TFT is formed will be almost the same value S1.

The drain electrode SD1 branched from the video signal line DL to be connected to the drain region of the semiconductor layer SC has its center line branched at the position overlapping with the center line M of the scan signal line GL and extended in the extending direction of the scan signal lines GL. In the layout data of the designing stage, the width (dimension in y direction) of the drain electrode SD1 is $L4_1$, and the angle $\theta_1$ between the drain electrode SD1 and the video signal line DL is $\pi/2$ (rad.).

When manufacturing a TFT substrate 101, as have been described above, as the scan signal lines GL, semiconductor layer SC, video signal lines DL, etc. are formed based on the layout data previously provided, it is believed in general that the finished dimension of scan signal lines GL and so on in the finished TFT substrate 101 is almost matched with the layout data of the designing stage.

However, when manufacturing a TFT substrate 101 in practice, there may be cases in which, as shown in FIG. 4B, even though the width of each scan signal line GL is formed to be $GLW_1$ based on the layout data, the width (finished dimension) of the scan signal lines GL actually formed may be GLW2 (>GLW1), in other words, may become wider than the layout data of the designing stage.

In the conventional manufacturing method of the TFT substrate 101, the drain electrode SD1 branched from the video signal line DL may have its center line formed at the position overlapping with the center line M of the scan signal line GL for example, irrespective of the width of the scan signal line GL. Therefore, the relationship between the distance $L1_2$ from the end GLb1 of the scan signal line GL to the edge of the source electrode SD2 opposing to the drain electrode SD1, the distance $L2_2$ from the end GLb1 of the scan signal line GL to the edge of the drain electrode SD1 opposing to the source electrode SD2, the distance $L3_2$ from the end GLb1 of the scan signal line GL to the edge of the semiconductor layer SC and three distances $L1_1, L2_1, L3_1$ shown in FIG. 4A will be such that $L2_1>L1_1, L2_2>L2_1,$ and $L3_2>L3_1$. As a result, the surface area $SGS_2$ of the overlap region overlapping the source electrode SD2 with the scan signal line GL in the plan view will be $S_2$ ($>S_1$), thus the value of the wiring capacity CGS will be larger than the value determined in the designing stage.

In the TFT substrate 101 of the first embodiment, when the width of the scan signal line GL actually formed becomes a value $GLW_2$ which is larger than the width $GLW_1$ in the design stage, for example as shown in FIG. 4C, the position in y direction of the semiconductor layer SC, the edge of the drain electrode SD1 opposing to the source electrode SD2, and the edge of the source electrode SD2 opposing to the drain electrode SD1 are displaced in the direction toward the edge GLb1 of the scan signal line GL such that the distance from the end GLb1 of the scan signal line GL to the edge of the source electrode SD2 opposing to the drain electrode SD1 becomes $L1_1$, the distance from the end GLb1 of the scan signal line GL to the edge of the drain electrode SD1 opposing to the source electrode SD2 becomes $L2_1$, and the distance from the end GLb1 of the scan signal line GL to the edge of the semiconductor layer SC becomes $L3_1$. In such a way, the surface area $SGS_2$ of the overlap region of the source electrode SD2 overlapping with the scan signal line GL in the plan view may be adjusted to S1 while maintaining the channel width and the channel length of the TFT to the layout data of the designing stage, in particular to the same value as the channel width and the channel length of the TFT when the width of the scan signal lines GL is GLW1. Therefore the value of the wiring capacity $C_{GS}$ may be set to the value of the designing stage while maintaining the operation characteristics of the TFT.

In this case the connection position of the video signal line DL with the drain electrode SD1 should be the same as the layout data of the designing stage, the connection angle between the part SD1br which connects the video signal lines DL with the part in contact with the drain region of the semiconductor layer SC in the drain electrode $SD1_{br}$ and the video signal line DL should be $\theta_2$ ($>\theta_1$).

When forming the TFT substrate 101 in practice, although forming based on the layout data such that the width of each of scan signal lines GL becomes GLW1, for example as shown in FIG. 4D, the width of actually formed scan signal lines GL (finished dimension) may become GLW3 (<GLW1), in other words may become narrower than the width in the layout data of the designing stage.

In accordance with the conventional manufacturing method of the TFT substrate 101, the drain electrode SD1 branched from the video signal line DL has its center line M formed at the position overlapping with the center line M of the scan signal line GL for example, irrespective of the width of the scan signal line GL. Because of this, the relationship between the distance $L1_3$ from the end GLb1 of the scan signal line GL to the edge of the source electrode SD2 opposing to the drain electrode SD1, the distance $L2_3$ from the end GLb1 of the scan signal line GL to the edge of the drain electrode SD1 opposing to the source electrode SD2, the distance $L3_3$ from the end GLb1 of the scan signal line GL to the edge of the semiconductor layer SC and three distances shown in FIG. 4A, $L1_1, L2_1, L3_1$ will be such that $L1_3<L1_1, L2_3<L2_1,$ and $L3_3<L3_1$. As a result the surface area SGS3 of the overlap region of the source electrode SD2 overlapping with the scan signal line GL when viewing in plan view from the top will be S3 (<S1), thus the value of the wiring capacitance CGS will be less than the value in the designing stage.

In case of the TFT substrate 101 of the first preferred embodiment, if the actually formed width of the scan signal line GL becomes a value GLW3, which is narrower than the value GLW1 in the designing stage, for example, as shown in FIG. 4E, the position in y direction of the semiconductor layer SC, the edge of the drain electrode SD1 opposing to the source electrode SD2, and the edge of the source electrode SD2 opposing to the drain electrode SD1 should be displaced in the direction opposite to the end GLb1 of the scan signal line GL, such that the distance from the end GLb1 of the scan signal line GL to the edge of the source electrode SD2 opposing to the drain electrode SD1 becomes $L1_1$, the distance from the end GLb1 of the scan signal line GL to the edge of the drain electrode SD1 opposing to the source electrode SD2 becomes $L2_1$, and the distance from the end GLb1 of the scan signal line GL to the edge of the semiconductor layer SC becomes $L3_1$. In this manner, the surface area SGS3 of the overlap region of the source electrode SD2 overlapping with the scan signal line GL may be adjusted to S1 while maintaining the channel width and the channel length of the TFT to the layout data in the designing stage, in other words to the same value as the channel width and the channel length of the TFT when the width of the scan signal line GL is GLW1. By doing this the value of the wiring capacitance CGS may be set to the value determined in the designing stage, while maintaining the operation characteristics of the TFT.

The connection position between the video signal line DL and the drain electrode SD1 in this case should be the same as the layout data in the designing stage, the connection angle between the part SD1br connecting the part in the drain electrode SD1 in contact with the drain region of the semiconductor layer SC to the video signal line DL and the video signal line DL should be $\theta_3$ ($<\theta_1$).

In the first embodiment, there are shown three possible cases where the width of the actually formed scan signal line GL is either the width $GLW_1$ of the layout data in the designing stage, or the width is GLW2 larger than the width $GLW_1$ of the layout data in the designing stage, or the width is $GLW_3$ narrower than the width GLW1 of the layout data in the designing stage. There may be cases in which, when measuring the width of actually formed scan signal line GL, some part may have a value between the width $GLW_1$ and the width $GLW_2$, another part may have a value wider than the width $GLW_2$, still another part may have a value between the width $GLW_1$ and the width $GLW_3$, and yet another part may have a value narrower than the width $GLW_3$. When manufacturing the TFT substrate 101 in accordance with the concept of the first preferred embodiment, for example, based on the relationship of connection angle CA (rad.) in the connection part SD1br between the width GLW of the scan signal line GL and the drain electrode SD1, as shown in FIG. 4F, the distance from the end GLb1 of the scan signal line GL to the edge of the source electrode SD2 opposing to the drain electrode SD1, the distance from the end GLb1 of the scan signal line GL to the edge of drain electrode SD1 opposing to the source electrode SD2, and the distance from the end GLB of the scan signal line GL to the edge of the semiconductor layer SC should be determined. The graph shown in FIG. 4F indicates an example, illustrating the relationship $PF_{CA}$ between the width of the scan signal line GL and the connection angle of the connection part $SD1_{br}$ of the drain electrode SD1, and the change in surface area PFSGS in the overlap region when viewing in plan view from the top overlapping the source electrode SD2 with the scan signal line GL, the result found by the inventors of the present invention. In the graph the abscissa indicates the width GLW (micrometer) of the scan signal line GL, the ordinate in the left hand side indicates the connection angle CA (rad.) of the connection part $SD1_{br}$ of the drain electrode SD1, and the ordinate in the right hand side indicates the surface area SGS (micrometer square) of the overlap region when viewing in plan view from the top overlapping the source electrode SD2 with the scan signal line GL.

By forming the semiconductor layer SC, the drain electrode SD1, and the source electrode SD2 such that when the width GLW of the scan signal line GL becomes wider, the connection angle CA of the drain electrode SD1 increases monotonously, the surface area SGS of the overlap region overlapping the source electrode SD2 with the scan signal line GL when viewing in plan view from the top, in each pixel, will be almost same as the surface area S1 in the design stage. Accordingly the value of wiring capacitance $C_{GS}$ in each pixel can be almost equalized, allowing the uneven image quality caused by the difference in the wiring capacitance CGS to be decreased. Without widening the scan signal line GL as was done in the TFT substrate 101 of the prior art, the value of the wiring capacitance $C_{GS}$ in each pixel may be almost equalized, allowing preventing the number of aperture from decreasing.

Figure 5A:
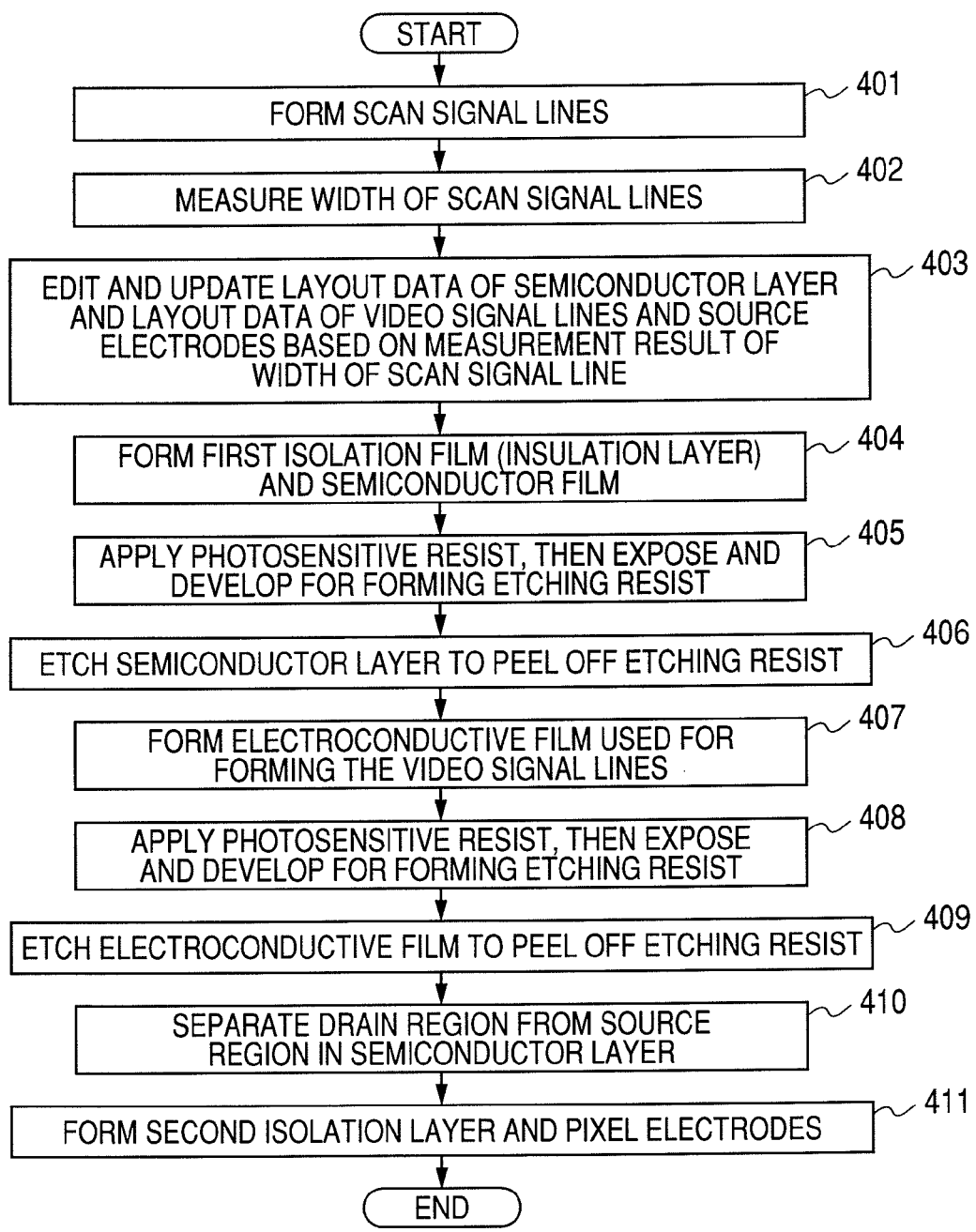
FIG. 5A shows a schematic flow diagram illustrating an exemplary manufacturing method of the TFT substrate 101 in the first preferred embodiment.
Figure 5B:
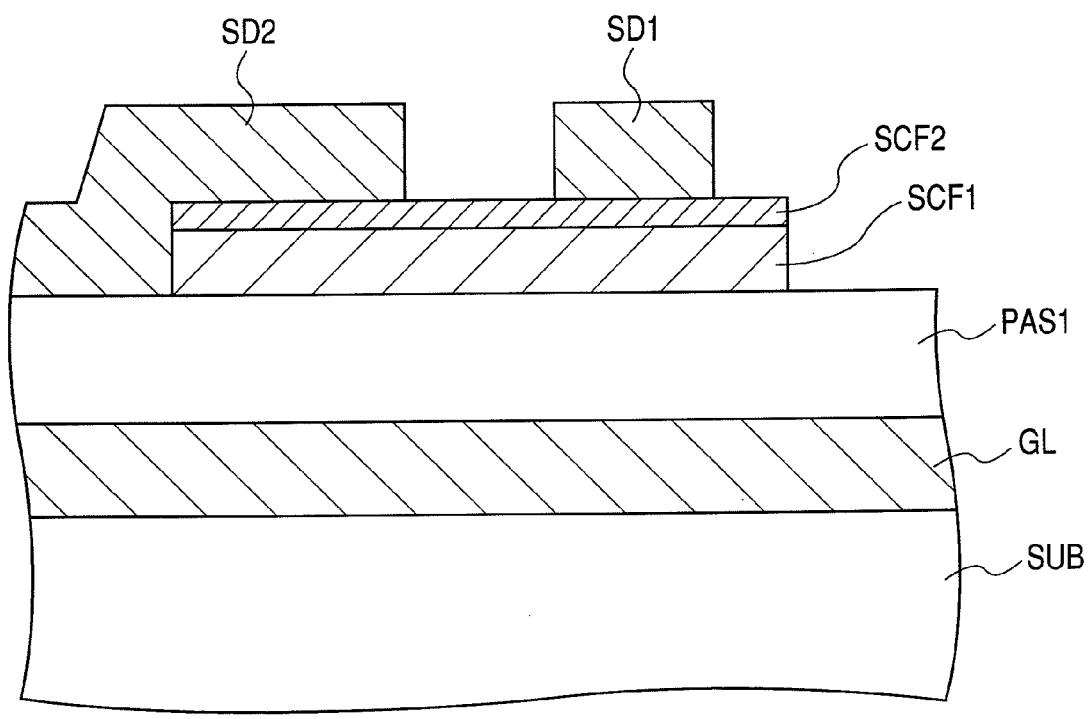
FIG. 5B shows a schematic cross-sectional view illustrating an exemplary arrangement of the TFT forming section immediately after the step 409 of FIG. 5A.
Figure 5C:
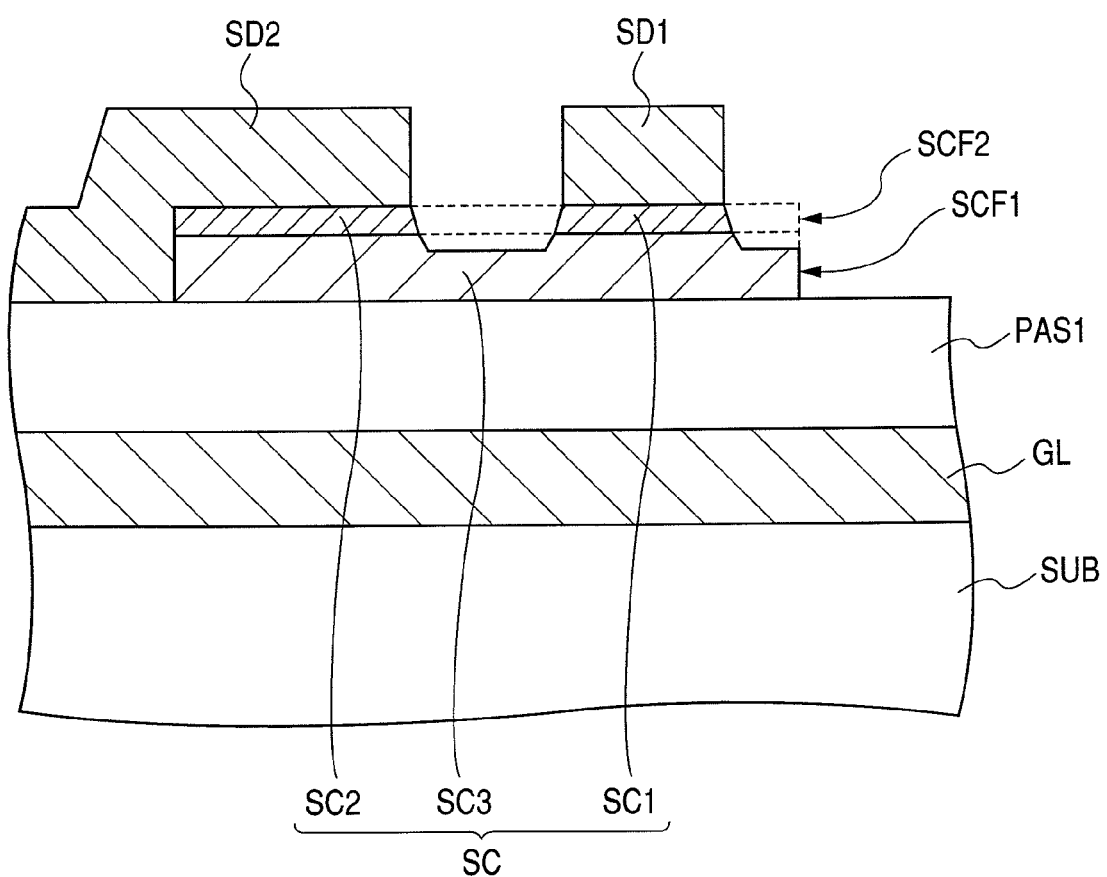
FIG. 5C shows a schematic cross-sectional view illustrating an exemplary arrangement of the TFT forming section immediately after the step 410 of FIG. 5A.

Now referring to FIGS. 5A to 5C, FIG. 5A shows a schematic flow diagram illustrating an exemplary manufacturing method of the TFT substrate 101 in the first preferred embodiment. FIG. 5B shows a schematic cross-sectional view illustrating an exemplary arrangement of the TFT forming section immediately after the step 409 of FIG. 5A. FIG. 5C shows a schematic cross-sectional view illustrating an exemplary arrangement of the TFT forming section immediately after the step 410 of FIG. 5A.

For manufacturing the TFT substrate 101 in accordance with the first preferred embodiment, for example, as shown in FIG. 5A, plural scan signal lines GL are formed on the surface of an insulation substrate SUB such as glass substrate (step 401). Since the step 401 is the same process step as the forming step of the scan signal lines GL in the conventional manufacturing method of the TFT substrate 101, detailed description thereof will be omitted.

Next, the width of the scan signal lines GL formed in step 401 is measured (step 402). Since in the step 402 the width may be measured by means of for example a step transition meter, a laser spectrometer, or an image taken with a camera, detailed description thereof will be omitted.

Next, based on the measurement result of step 402, the layout data of the semiconductor layer SC, and the layout data of the video signal line DL (drain electrode SD1) and the source electrode SD2 will be edited and updated (step 403). In the step 403, for example, based on the graph as shown in FIG. 4F, the connection angle CA of the drain electrode SD1 is first determined, then the coordinate values of every forming position will be edited and updated such that the distance from the end GLB of the scan signal line GL to the tip of the source electrode SD2, the distance from the end GLB of the scan signal line GL to the drain electrode SD1, and the distance from the end GLB of the scan signal line GL to the edge of the semiconductor layer SC will be respectively the same as the values in the layout data in the designing stage.

Then, first insulation film is deposited to form the first insulation layer PAS1, next, the semiconductor film is deposited (step 404). The step 404 is the same process step as the process step of forming the first insulation layer PAS1 and the semiconductor film in the conventional manufacturing method of the TFT substrate 101, therefore detailed description thereof will be omitted.

Next, after applying photosensitive resist onto the semiconductor film, the resist are exposed and developed to form the etching resist (step 405). In the step 406, for exposing the photosensitive resist, an exposure unit such as that called direct drawing exposure unit is used. The direct drawing exposure unit is an exposure unit which splits the exposure area of the photosensitive resist into a number of minute regions, then determines whether or not each micro region should be exposed based on the layout data (numeric data) created by a CAD, and performs the exposure sequentially or at once only the regions determined to be exposed. In this step, the direct drawing exposure unit uses the layout data of the semiconductor layer SC updated in step 403.

When using the direct drawing exposure unit, by only updating the numeric values in the layout data to be used, the exposure pattern (exposure regions) can be varied. Because of this, even when the degree of change in the film thickness of the first insulation layer PAS1 for each TFT substrate 101, the exposure unit may follow the change faster and flexibly. In case of the direct drawing exposure unit, the exposure mask used in the conventional exposure unit is not necessary so that the manufacturing cost can be saved.

Next, after having etched the semiconductor film, the etching resist is peeled off (removed) to form the semiconductor layer SC (step 406).

Next, the conductive layer (the second conductive film) for use in forming the video signal line DL is formed (step 407). The step 407 is also the process step same as that of forming a conductive layer for use in forming the video signal line DL in the conventional manufacturing method of the TFT substrate 101, detailed description thereof will be omitted.

Next, after applying photosensitive resist onto the conductive film formed in step 407, the resist is exposed and developed to form the etching resist (step 408). In the step 408, when exposing the photosensitive resist, an exposure unit such as that called direct drawing exposure unit may be used. The direct drawing exposure unit in this case uses the layout data of the video signal line DL (including the drain electrode SD1) and the source electrode SD2 updated in step 403.

Next, after having etched the conductive layer, the etching resist is peeled off (removed) to form the video signal line DL, the drain electrode SD1, and the source electrode SD2 (step 409).

For forming the semiconductor layer SC, as shown in FIG. 5B for example, a second semiconductor layer SCF2 is deposited on the first semiconductor layer SCF1. In this case the second semiconductor layer SCF2 is a semiconductor film to be used for forming the drain region and the source region, which may be an n-type semiconductor film containing a high dose of impurity. The first semiconductor film SCF1 is a semiconductor film used for forming the channel region, which may be a p-type or n-type semiconductor film containing a low dose of impurity, or may be a pure semiconductor film.

Immediately after performing the process step of step 409, there is only one second semiconductor film SCF2. By separating the second semiconductor film SCF2 into the drain region SC1 and the source region SC2 as shown in FIG. 5C, by etching by using the drain electrode SD1 and the source electrode SD2 as masks, a semiconductor layer SC having the drain region SC1, the source region SC2, and the channel region SC3 is obtained (step 410).

Thereafter, by forming a second insulation layer PAS2 followed by forming a pixel electrode PX (step 411), the TFT substrate 101 having the structure as shown in FIG. 3A to FIG. 3C can be obtained.

In the foregoing description of manufacturing method, in step 405 and in step 407, when exposing the photosensitive resist, a direct drawing exposure unit is used by way of example. However, it is needless to say that in step 405, for example, the photosensitive resist may be exposed using an exposure mask created based on the layout data of the semiconductor layer SC updated in step 403. In a similar manner, in step 407, the photosensitive resist may be exposed using an exposure mask created based on the layout data of the video signal line DL (including the drain electrode SD1) and the source electrode SD2 updated in step 403 as well.

Figure 6A:
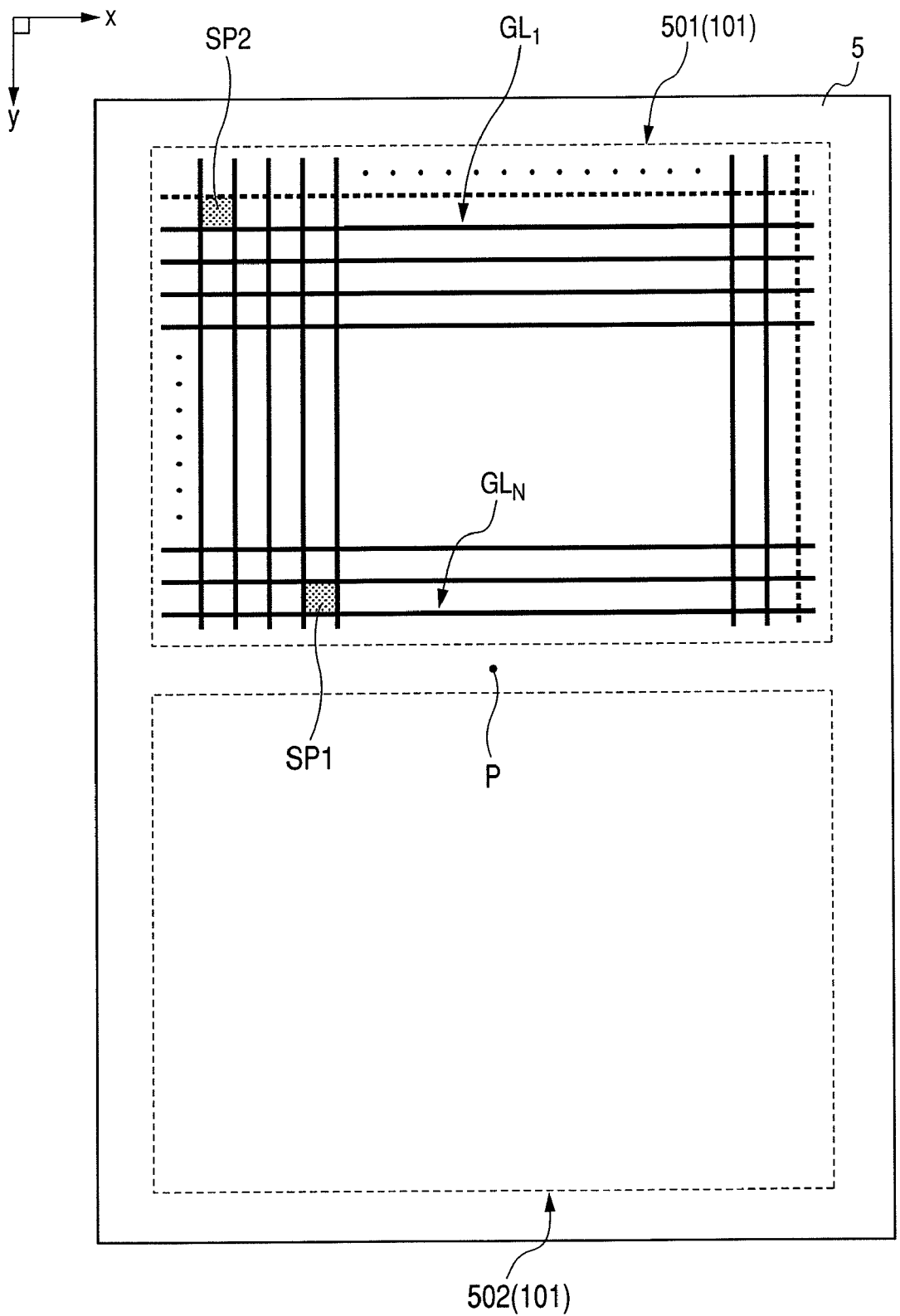
FIG. 6A shows a schematic plan view illustrating an example of the relationship between the manufacturing method of the TFT substrate in accordance with the first preferred embodiment and the effect thereof.
Figure 6B:
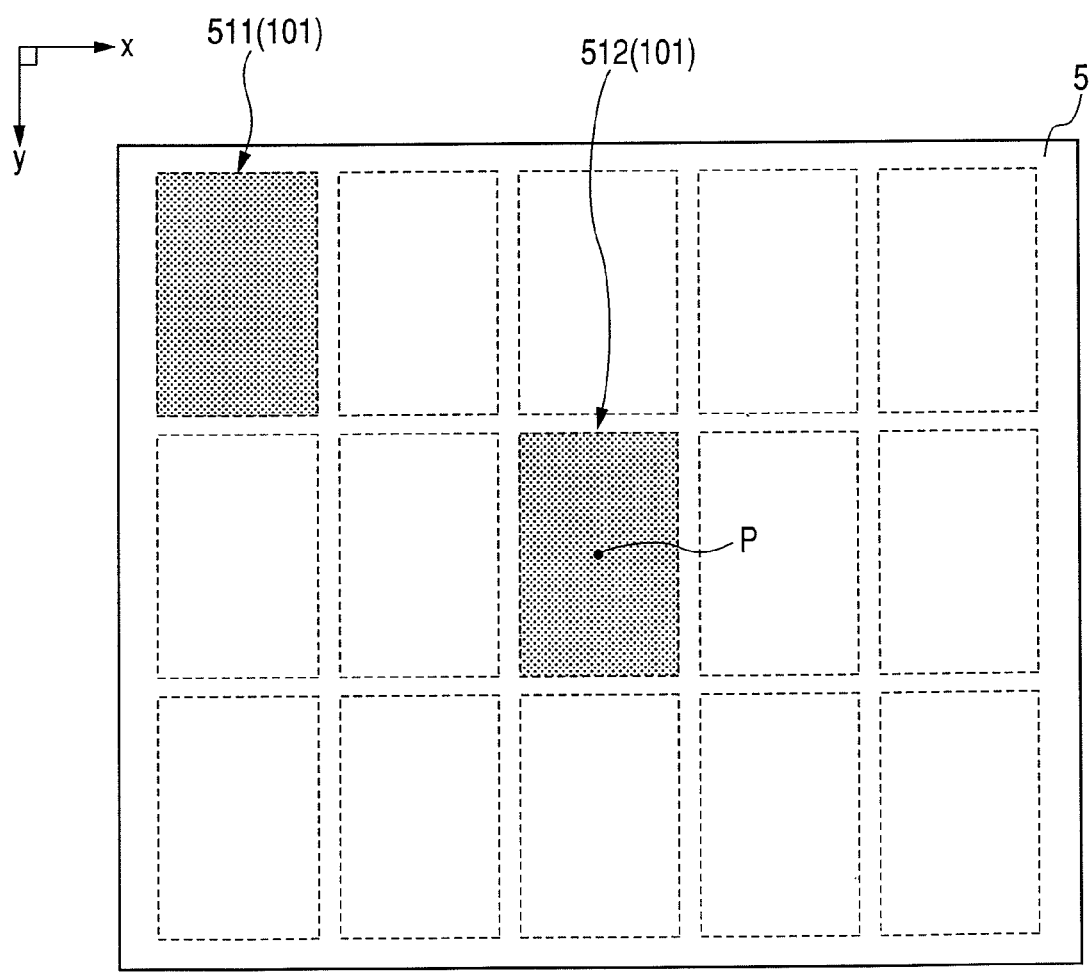
FIG. 6B shows a schematic plan view illustrating another example of the relationship between the manufacturing method of the TFT substrate in accordance with the first preferred embodiment and the effect thereof.

Now referring to FIGS. 6A and 6B, FIG. 6A shows a schematic plan view illustrating an example of the relationship between the manufacturing method of the TFT substrate in accordance with the first preferred embodiment and the effect thereof. FIG. 6B shows a schematic plan view illustrating another example of the relationship between the manufacturing method of the TFT substrate in accordance with the first preferred embodiment and the effect thereof.

The arrangement of pixels and obtainable effect will be slightly different when the arrangement as described above in the first preferred embodiment is applied to the TFT substrate 101 to be used in a large liquid crystal display device such as a liquid crystal display television set or a personal computer display (monitor), from when applied to the TFT substrate 101 to be used in a smaller liquid crystal display device such as a display of a cellular phone terminal or a PDA.

When manufacturing a TFT substrate 101 to be used in a larger liquid crystal display device, for example, as shown in FIG. 6A, a TFT substrate 101 may be formed in each of two areas 501 and 502 of one single large surface area insulation substrate (mother glass) 5. After cutting out from the mother glass 5 these areas 501 and 502, two TFT substrates 101 are obtained.

In case of the TFT substrate 101 to be used in a large liquid crystal display device as described above, for example, in a single TFT substrate 101 formed in the area 501, it is possible that, when comparing the width of the scan signal line GLN in the vicinity of the pixel SP1 having a short distance from the center P (gravity center) of the mother glass 5 with the width of the scan signal line $GL_1$ in the vicinity of the pixel SP2 having a long distance from the center P of the mother glass 5, the width of the scan signal line $GL_1$ in the vicinity of the pixel SP2 may be narrower than the width of the scan signal line $GL_N$ in the vicinity of the pixel SP1. The reason of fluctuation in the width of the scan signal line GL as described above is that when forming the conductive film for forming the scan signal line GL, the film thickness of the conductive film layer may change, in other words may be the thicker in the vicinity of the center P of the mother glass 5, and may be gradually thinner as far as the center P.

When applying the arrangement in accordance with the first preferred embodiment to the TFT substrate 101 to be used in a large liquid crystal display device, the arrangement as shown in FIG. 4A, the arrangement as shown in FIG. 4C, and the arrangement as shown in FIG. 4E may be found coexisting in one single TFT substrate 101. By forming as such arrangements, the uneven image quality (brightness unevenness) in one single display area of a single liquid crystal display device may be decreased.

When manufacturing the TFT substrate 101 to be used in a smaller liquid crystal display device, as shown in FIG. 6B, one single TFT substrate 101 is formed for each of 15 areas of one mother glass 5. When each of these areas is cut out from the mother glass 5, 15 TFT substrates 101 are obtained.

In case of the TFT substrate 101 to be used in a smaller liquid crystal display device, one area 511 used to form one TFT substrate 101 has a smaller surface area. Because of this when forming the conductive layer for forming the scan signal line GL, the change of film thickness of the conductive layer within one area 511 is much less, and the width of plural scan signal lines formed in one area 511 may be considered to be uniform.

However, in case of forming plural TFT substrates 101 at once using a mother glass 5, it is possible that, when forming the conductive layer for forming the scan signal line GL, for example an area 512 including the center P of the mother glass 5 and an area 511 at the corner of the mother glass 5 may have a larger variation of film thickness of the conductive layer. As a result the width of the scan signal lines formed in one area 511 may differ from the width of the scan signal lines formed in another area 512.

As can be appreciated from the foregoing description, the TFT substrate 101 to be used in a smaller liquid crystal display device, may have less uneven image quality in one display area of a liquid crystal display device, however, the individual variability of image quality between plural liquid crystal display device each having a TFT substrate 101 formed at once from one mother glass 5 may be, in comparison, considerable.

When applying the arrangement of the first preferred embodiment to the TFT substrate 101 to be used in a smaller liquid crystal display device, each TFT substrate 101 will have a slightly different arrangement such that one TFT substrate 101 cut out from the area 511 will have the arrangement as shown in FIG. 4C, the TFT substrate 101 cut out from the area 512 will have the arrangement as shown in FIG. 4B, and so on. By forming with such arrangement, the individual difference of image quality between plural liquid crystal display devices manufactured by using TFT substrates 101 cut out from one single mother glass 5 may be decreased.

Figure 7:
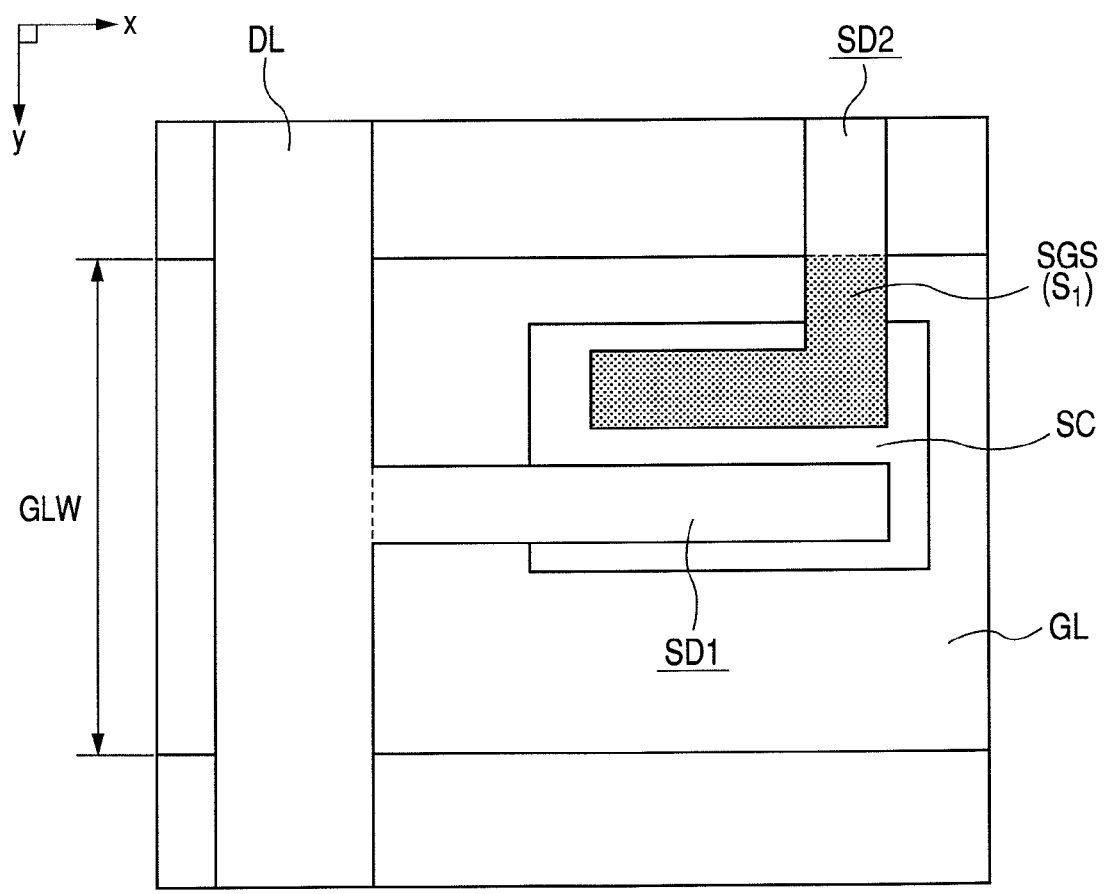
FIG. 7 shows a schematic plan view illustrating a variation of TFT in the TFT substrate in accordance with the first preferred embodiment.

Now referring to FIG. 7, there is shown a schematic plan view illustrating a variation of TFT in the TFT substrate in accordance with the first preferred embodiment.

In the first preferred embodiment, as an example of plan shape of the TFT (active elements), the source electrode SD2 is in a plan shape as shown in FIG. 4A. However the plan shape of the source electrode SD2 can also be as shown in FIG. 7, having an L-shape overlap region overlapping with the semiconductor layer SC when viewing in plan view. in this case, by manufacturing the TFT substrate 101 according to the procedure shown in FIG. 5A, the surface area SGS of the overlap region in plan view (i.e., the plan shape) overlapping source electrode SD2 with the scan signal line GL of each TFT will be constant even when the width GLW of the scan signal line GL changes, and the channel width and the channel length will also be constant.

Furthermore, as is not shown in the figure, the concept according to the first preferred embodiment may be applied to the drain electrode SD1, when the plan shape thereof is U-shape.

Second Embodiment

Figure 8D:
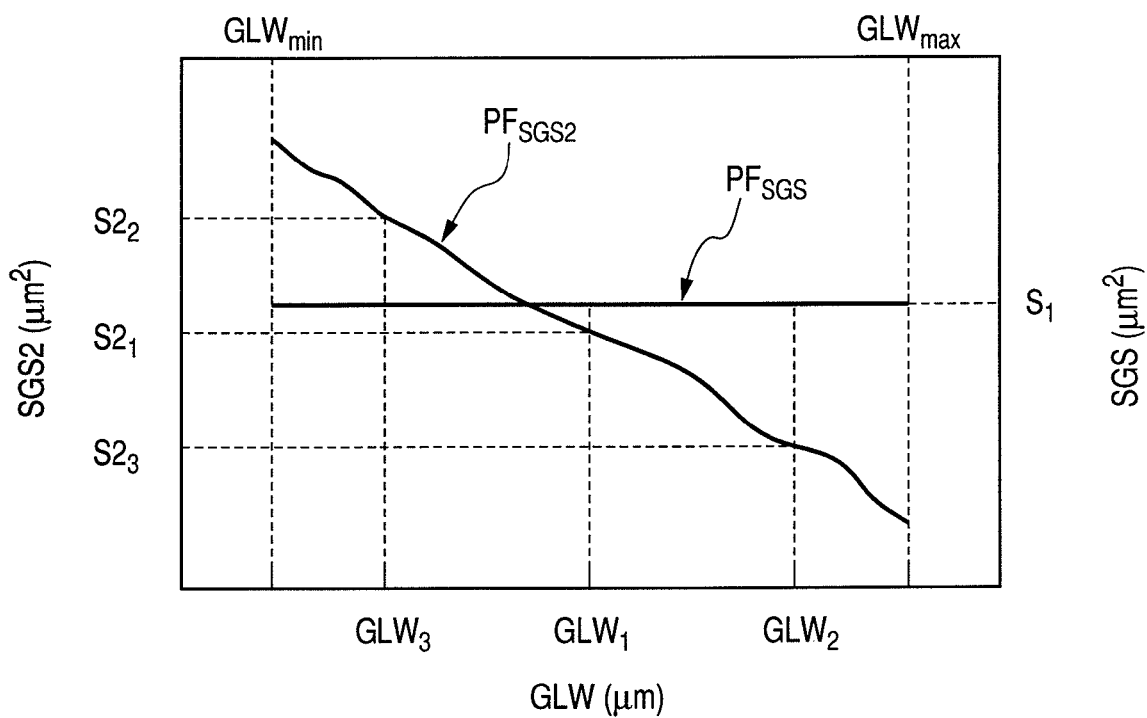
FIG. 8D shows a schematic diagram illustrating the relationship between the width of scan signal line and the surface area of branch section of the source electrode in the TFT substrate in accordance with the second preferred embodiment of the present invention.

Now referring to FIGS. 8A to 8D, FIG. 8A shows a schematic plan view illustrating the fundamental arrangement of a TFT in accordance with a second preferred embodiment of the present invention. FIG. 8B shows a schematic plan view illustrating first feature of the TFT substrate in accordance with the second preferred embodiment of the present invention. FIG. 8C shows a schematic plan view illustrating second feature of the TFT substrate in accordance with the second preferred embodiment of the present invention. FIG. 8D shows a schematic diagram illustrating the relationship between the width of scan signal line and the surface area of branch section of the source electrode in the TFT substrate in accordance with the second preferred embodiment of the present invention.

In the first embodiment, by displacing the semiconductor layer SC, the edge of the drain electrode SD1 opposing to the source electrode SD2, and the edge of the source electrode SD2 opposing to the drain electrode SD1 by corresponding to the width of the scan signal line GL, the surface area SGS of the overlap region in plan view overlapping the source electrode SD2 with the scan signal line GL in each TFT are held constant without regard of the width of the scan signal line GL.

In the second embodiment, an arrangement of the TFT substrate 101 for keeping constant the surface area SGS of the overlap region in plan view overlapping the source electrode SD2 with the scan signal line GL irrespective of the width of the scan signal line GL in accordance with a method different from the first embodiment will be described in greater details.

As shown in FIG. 8A, for each TFT in the TFT substrate 101 in accordance with the second preferred embodiment, the semiconductor layer SC, the drain electrode SD1 connected to the drain region of the semiconductor layer SC, and the source electrode SD2 connected to the source region of the semiconductor layer SC will be formed in the overlap region in plan view overlapping with the scan signal line GL having the width (dimension in y direction) of GLW1. The scan signal line GL, the semiconductor layer SC, the drain electrode SD1, the source electrode SD2 in this case will be formed based on the layout data previously prepared. If each TFT is formed complying with the layout data previously prepared, the distance $L1_1$ from the end GLb1 of the scan signal line GL opposing to the pixel electrode PX connected to the source electrode SD2 to the edge of the source electrode SD2 opposing to the drain electrode SD1 will be almost the same value in each region having a TFT formed. Similarly, the distance $L2_1$ from the end GLb1 of the scan signal line GL to the edge of the drain electrode SD1 opposing to the source electrode SD2, as well as the distance $L3_1$ from the end GLb1 of the scan signal line GL to the end of the semiconductor layer SC, in each region having a TFT formed, will also be almost the same value.

The source electrode SD2 of the TFT substrate 101 in accordance with the second preferred embodiment has a region which overlaps with the scan signal line GL in plan view, and which is branched from the direction connecting from the region in contact with the source region of the semiconductor layer SC to the region in connection with the pixel electrode PX (extending direction), between the region in contact with the source region of the semiconductor layer SC and the region in connection with the pixel electrode PX. If each TFT is formed complying with the layout data in the designing stage, the surface area ($SGS1_1+SGS2_1$) of the overlap region overlapping the source electrode SD2 with the scan signal line GL in plan view in each region having a TFT formed will be almost the same value ($S1_1+S2_1$).

The drain electrode SD1 branched from the video signal line DL to connect to the drain region of the semiconductor layer SC will have the width of the drain electrode SD1 (dimension in y direction) of L41, and the angle θ1 between the drain electrode SD1 and the video signal line DL of for example π/2 (rad.).

When manufacturing the TFT substrate 101 of the arrangement in accordance with the second preferred embodiment, although the substrate is formed based on the layout data so as for the width of the scan signal line GL to be GLW1, as shown in FIG. 8B, the width of the actually formed scan signal line GL (finished dimension) may become GLW2 (>GLW1), i.e., the width may be wider than that in the layout data of the designing stage.

In the TFT substrate 101 in accordance with the second preferred embodiment, the semiconductor layer SC, the drain electrode SD1, the source electrode SD2 are formed based on the layout data of the designing stage. Because of this, the relationship between the distance $L1_2$ from the end GLb1 of the scan signal line GL to the edge of the source electrode SD2 opposing to the drain electrode SD1, the distance $L2_2$ from the end GLb1 of the scan signal line GL to the edge of the drain electrode SD1 opposing to the source electrode SD2, the distance $L3_2$ from the end GLb1 of the scan signal line GL to the edge of the semiconductor layer SC, and three distance $L1_1, L2_1, L3_1$ shown in FIG. 8A will be, as shown in FIG. 8B, such that $L1_2 > L1_1$, $L2_2 > L2_1$, and $L3_2 > L3_1$.

In this manner, it is needless to say that the surface area $SGS1_2$ of first region within the overlap region in plan view overlapping the source electrode SD2 with the scan signal line GL is $S1_2$ ($>S1_1$).

In the TFT substrate 101 of the second embodiment, therefore, the surface area $SGS2_2$ of the overlap region (second region) overlapping the branched section of the source electrode SD2 with the scan signal line in plan view is adjusted to $S2_2$ ($<S2_1$) such that $S1_2+S2_2 := S1_1+S2_1$.

When manufacturing actually the TFT substrate 101, even though the width of the scan signal line GL is formed complying with the layout data so as to be GLW1, as shown in FIG. 8C, the width of the actually formed scan signal line GL (finished dimension) may be GLW3 (<GLW1), in other words may be narrower than the width in the layout data in the designing stage.

In this case, for the TFT substrate 101 of the second preferred embodiment, the semiconductor layer SC, the drain electrode SD1, the source electrode SD2 are formed complying with the layout data of the design stage. Because of this, as shown in FIG. 8C for example, the relationship between the distance $L1_3$ from the end GLb1 of the scan signal line GL to the edge of the source electrode SD2 opposing to the drain electrode SD1, the distance $L2_3$ from the end GLb1 of the scan signal line GL to the edge of the drain electrode SD1 opposing to the source electrode SD2, and the distance $L3_3$ from the end GLb1 of the scan signal line GL to the end of the semiconductor layer SC, as well as three distances $L1_1, L2_1, L3_1$ shown in FIG. 8A is such that $L1_3<L1_1$, $L2_3<L2_1$, $L3_3<L3_1$.

By doing this, it is needless to say that the surface area $SGS1_3$ of first region within the overlap region overlapping the source electrode SD2 with the scan signal line GL when viewing in plan view from the top will be $S1_3$ ($<S1_1$).

Then, in the TFT substrate 101 in accordance with the second preferred embodiment, the surface area $SGS2_3$ of the overlap region (second region) overlapping the branched section of the source electrode SD2 with the scan signal line when viewing in plan view from the top will be set to $S2_3$ ($>S2_1$), because the surface area $SGS1_3$ of the first region is narrowed, such that $S1_3+S2_3:=S1_1+S2_1$.

By doing this, even if the width of the scan signal line GL is different from the value in the designing stage, the wiring capacitance CGS to be formed between the source electrode SD2 and the scan signal line GL in each pixel will be the value determined at the designing stage. Since the layout data of the semiconductor layer SC, drain electrode SD1, and the section of the source electrode SD2 opposing to the drain electrode SD1 is not changed, the channel width and the channel length of each TFT will remain to the values of the designing stage. Accordingly the value of the wiring capacitance CGS can be adjusted to the value in the designing stage while maintaining the operation characteristics of the TFT.

In the second preferred embodiment, there are shown three possible cases in which the width of the actually formed scan signal line GL is either the width $GLW_1$ of the layout data in the designing stage, or width $GLW_2$ which is wider than the width $GLW_1$ of the layout data in the designing stage, or width $GLW_3$ which is narrower than the width $GLW_1$ of the layout data in the designing stage. When measuring the width of the actually formed scan signal line GL, there may be cases in which some part may have a value between the width $GLW_1$ and the width GLW2, another part may have a value wider than the width $GLW_2$, still another part may have a value between the width $GLW_1$ and the width $GLW_3$, and yet another part may have a value narrower than the width GLW3. For manufacturing the 101 in accordance with the concept of the second embodiment, for example, the dimension of the source electrode SD2 may be determined based on the relationship between the width GLW (micrometer) of the scan signal line GL and the surface area SGS2 of the branched section of the source electrode SD2 as shown in FIG. 8D. The graph shown in FIG. 8D indicates as an example the relationship $PF_{SGS2}$ between the width of the scan signal line GL and the surface area SGS2 of the branched section of the source electrode SD2, and the change in the surface area $PF_{SGS}$ at that time of the overlap region overlapping the source electrode SD2 with the scan signal line GL when viewing in plan view from the top, the result found by the inventors of the present invention. In the graph the abscissa indicates the width GLW (micrometer) of the scan signal line GL, the ordinate in the left hand side indicates the surface area SGS2 (micrometer square) of the branched section of the source electrode SD2, and the ordinate in the right hand side indicates the surface area SGS of the entire overlap region (micrometer square) overlapping the source electrode SD2 with the scan signal line GL when viewing in plan view from the top.

By forming the source electrode SD2 such that the surface area SGS2 of the branched section of the source electrode SD2 monotonously decreases as the width GLW of the scan signal line GL is widening, the surface area SGS of the entire overlap region overlapping the source electrode SD2 with the scan signal line GL when viewing in plan view from the top in each pixel will be almost same value as the surface area S1 in the designing stage. Accordingly, the value of the wiring capacitance $C_{GS}$ in each pixel may also be adjusted to almost same value, allowing the uneven image quality caused by the difference of the wiring capacitance $C_{GS}$ to be decreased. Without widening the width of the scan signal line GL as was done in the TFT substrate 101 of the prior art, the value of the wiring capacitance $C_{GS}$ in each pixel may be almost equalized, allowing preventing the number of aperture from decreasing.

Figure 9:
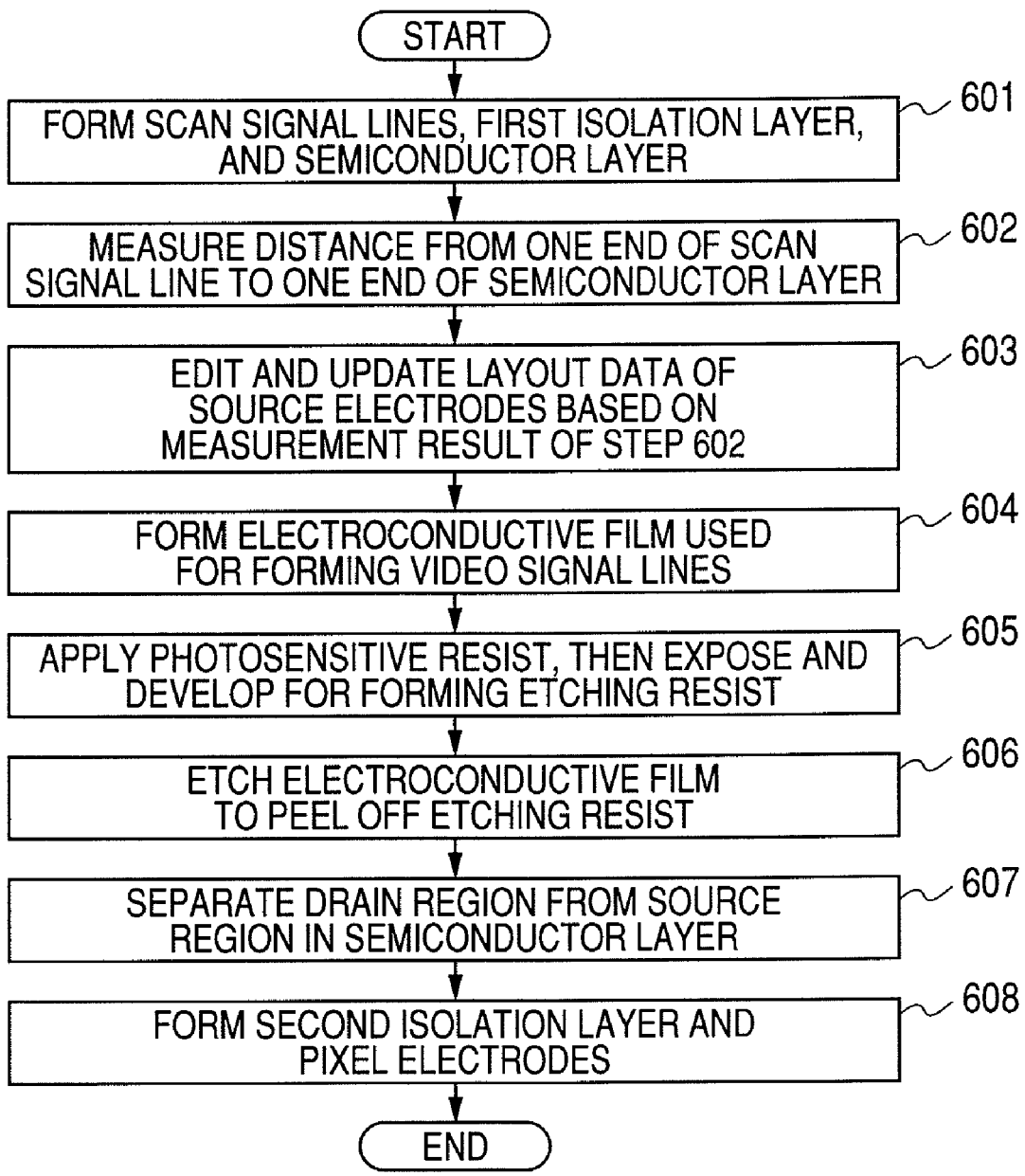
FIG. 9 shows a schematic flow diagram illustrating the manufacturing method of a TFT substrate in accordance with the second preferred embodiment.

Now referring to FIG. 9 there is shown a schematic flow diagram illustrating the manufacturing method of a TFT substrate in accordance with the second preferred embodiment.

For manufacturing the TFT substrate 101 in accordance with the second preferred embodiment, as shown in FIG. 9, for example, plural scan signal lines GL, a first insulation layer PAS1, and a semiconductor layer SC are formed on the surface of an insulation substrate SUB such as glass substrate (step 601). Since the step 601 is the same as the sequential process steps of forming the scan signal line GL, the first insulation layer PAS1, and the semiconductor layer SC in the conventional manufacturing method of the TFT substrate 101, detailed description thereof will be omitted.

Next, the distance L2 from the end GLb1 of the scan signal line GL formed in step 601 to the end of the semiconductor layer SC is measured (step 602). Since in the step 602 the distance may be measured by means of for example a step transition meter, a laser spectrometer, or an image taken with a camera, detailed description thereof will be omitted.

Next, based on the measurement result of step 602, the layout data of the source electrode SD2 is edited and updated (step 603). In step 603, for example, based on the graph of relationship as shown in FIG. 8D, the surface area SGS2 of the branched section of the source electrode SD2 in correspondence with the distance L2 is determined first, then the dimension of the branched section is edited and updated so as to have the determined surface area SGS2.

Next, the conductive film (the second conductive film) used for forming the video signal line DL is formed (step 604). The step 604 is the same as the process step of forming a conductive layer to be used for forming the video signal line DL in the conventional manufacturing method of TFT substrate 101, so detailed description thereof will be omitted.

Next, after applying photosensitive resist onto the conductive film formed in step 604, the resist is exposed and developed to form the etching resist (step 605). For exposing the photosensitive resist in step 605, an exposure unit such as that called direct drawing exposure unit is used. The direct drawing exposure unit uses the layout data of the source electrode SD2 updated in step 603.

Next, after having etched the conductive film, the etching resist is peeled off (removed) to form the video signal line DL, the drain electrode SD1, and the source electrode SD2 (step 606).

Immediately after the process step of step 606, as have been described in the first preferred embodiment, there is only one second semiconductor film SCF2 for forming the drain region and the source region. Because of this, by etching for example with the drain electrode SD1 and the source electrode SD2 used as masks to separate the second semiconductor film SCF2 into the drain region SC1 and the source region SC2 as shown in FIG. 5C (step 607).

Thereafter, by forming a second insulation layer PAS2 followed by forming a pixel electrode PX (step 608), the TFT substrate 101 having the structure as shown in FIG. 3A to FIG. 3C can be obtained.

In the foregoing description of manufacturing method, in step 605, when exposing the photosensitive resist, a direct drawing exposure unit is used by way of example. However, it is needless to say that in step 603 for example the photosensitive resist may be exposed using an exposure mask created based on the layout data of the source electrode SD2 updated in step 603.

When applying the arrangement in accordance with the second preferred embodiment as described above to a TFT substrate 101 to be used for a large liquid crystal display device, the arrangement shown in FIG. 8A, the arrangement shown in FIG. 8B, the arrangement shown in FIG. 8C may be found in one single TFT substrate 101. By forming as such arrangements, the uneven image quality (brightness unevenness) in one single described above of a single liquid crystal display device may be decreased.

When applying the arrangement in accordance with the second preferred embodiment to a TFT substrate 101 to be used in a smaller liquid crystal display device, each TFT substrate 101 may have a slightly different arrangement such that one TFT substrate 101 cut out from a certain area of the mother glass 5 may have the arrangement shown in FIG. 8B, another TFT substrate 101 cut out from another certain area of the mother glass 5 may have the arrangement shown in FIG. 8C, and so on. By forming as such arrangements, the individual variability of image quality in plural liquid crystal display devices manufactured by using the TFT substrates 101 cut out from one single mother glass 5 may also be decreased.

Furthermore, in the TFT substrate 101 in accordance with the second preferred embodiment, the plan shape of the source electrode SD2 can also have an L-shape overlap region overlapping with the semiconductor layer SC in plan view. In this case by manufacturing the TFT substrate 101 according to the procedure shown in FIG. 9, the surface area SGS of the entire overlap region overlapping the source electrode SD2 with the scan signal line GL in each TFT when viewing in plan view from the top will be constant even when the width of the scan signal line GL changes, and the channel width and the channel length will also be constant.

In addition, the concept according to the second preferred embodiment may be applied to the drain electrode SD1, when the plan shape thereof is of U-shape.

Third Embodiment

Figure 10A:
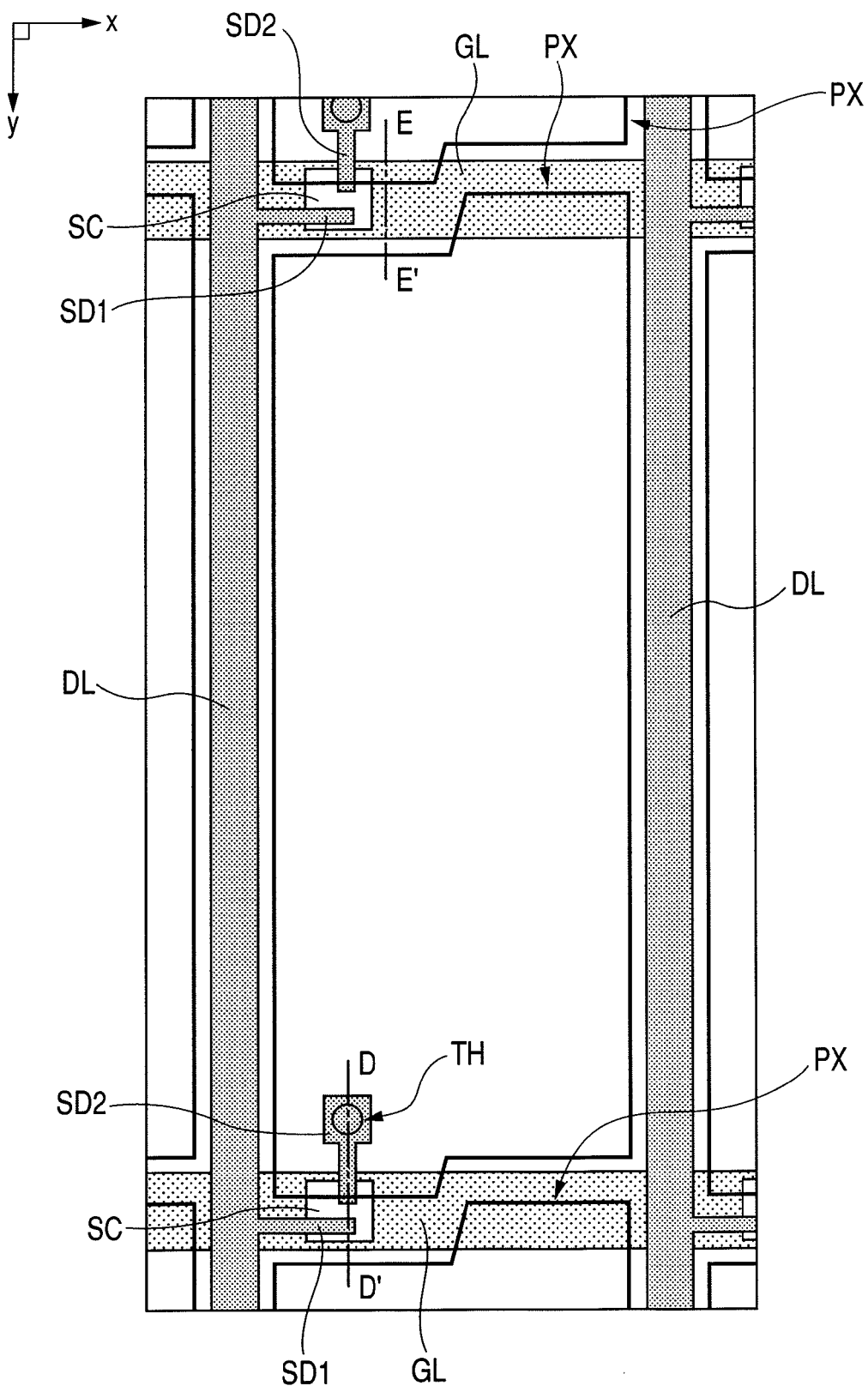
FIG. 10A shows a schematic plan view illustrating an exemplary arrangement of one pixel in a TFT substrate in accordance with third preferred embodiment of the present invention.
Figure 10B:
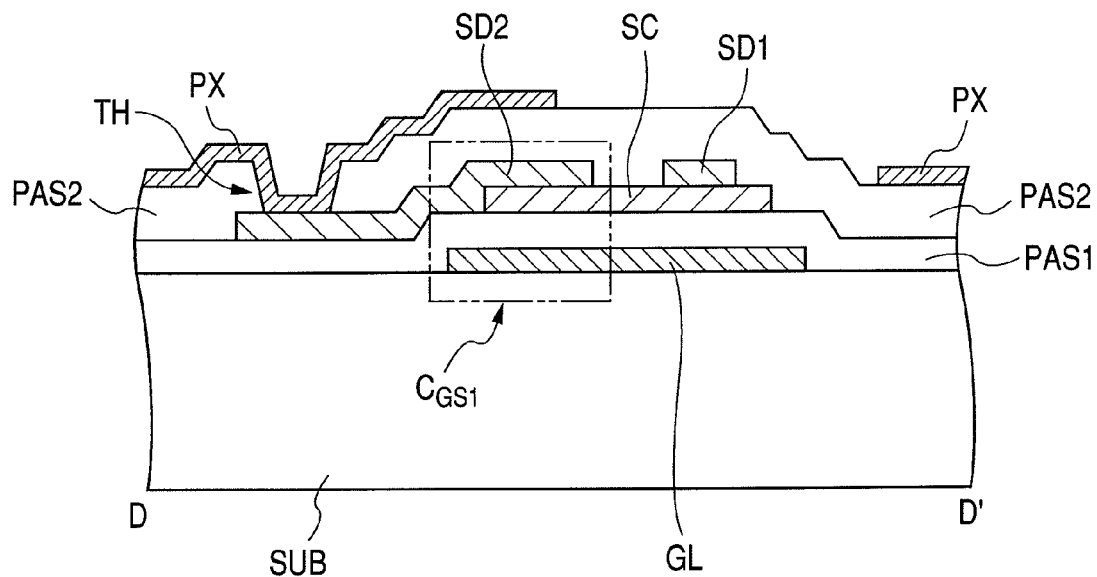
FIG. 10B shows a schematic cross-sectional view taken along with the line D-D' of FIG. 10A.
Figure 10C:
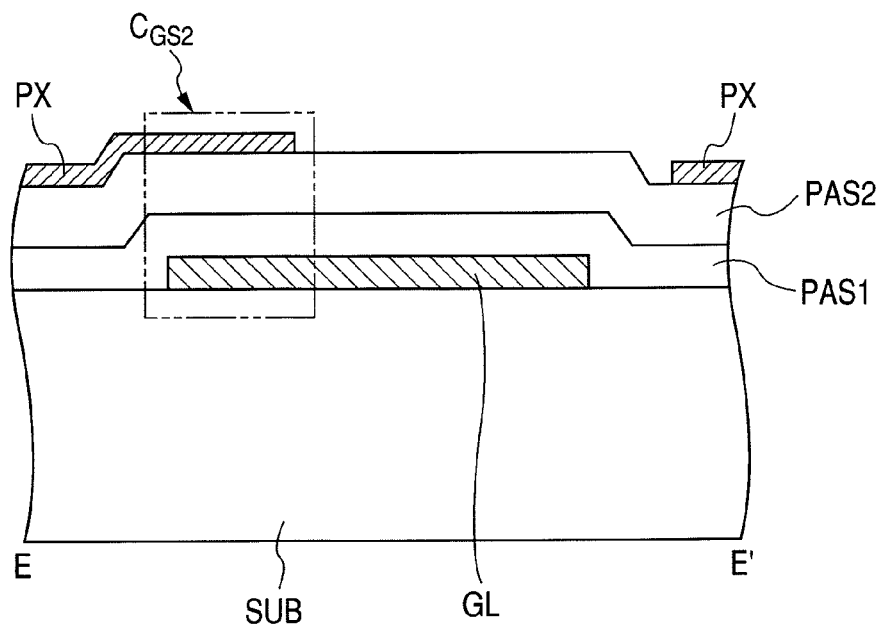
FIG. 10C shows a schematic cross-sectional view taken along with the line E-E' of FIG. 10A.

Now referring to FIGS. 10A and 10B, FIG. 10A shows a schematic plan view illustrating an exemplary arrangement of one pixel in a TFT substrate in accordance with third preferred embodiment of the present invention. FIG. 10B shows a schematic cross-sectional view taken along with the line D-D' of FIG. 10A. FIG. 10C shows a schematic cross-sectional view taken along with the line E-E' of FIG. 10A.

In the first and second preferred embodiments the surface area SGS of the overlap region overlapping the source electrode SD2 with the scan signal line GL in plan view is adjusted so as to adjust the fluctuation of the wiring capacitance formed between the source electrode SD2 and the scan signal line GL.

In the third preferred embodiment, which is different from the first and second preferred embodiments, a method of adjusting the fluctuation of wiring capacitance formed between the source electrode SD2 and the scan signal line GL by using the pixel electrode PX connected to the source electrode SD2 will be described in greater details.

The arrangement of a pixel in the TFT substrate 101 in accordance with the third embodiment is basically the same as the arrangement shown in FIG. 3A to FIG. 3C. However, in the TFT substrate 101 in accordance with the third preferred embodiment, as shown in FIG. 10A to FIG. 1C, a part of the pixel electrode PX is overlapped with the scan signal line GL connected to the gate of the TFT having the source electrode SD2 connected to the pixel electrode PX, when viewing in plan view. More specifically, in the TFT substrate 101 of the third preferred embodiment, the combined capacitance of first wiring capacitance $C_{GS1}$ formed between the source electrode SD2 and the scan signal line GL, and second wiring capacitance $C_{GS2}$ formed between the pixel electrode PX and the scan signal line GL correspond to the wiring capacitance $C_{GS}$ described above in the first and second preferred embodiments.

Figure 11B:
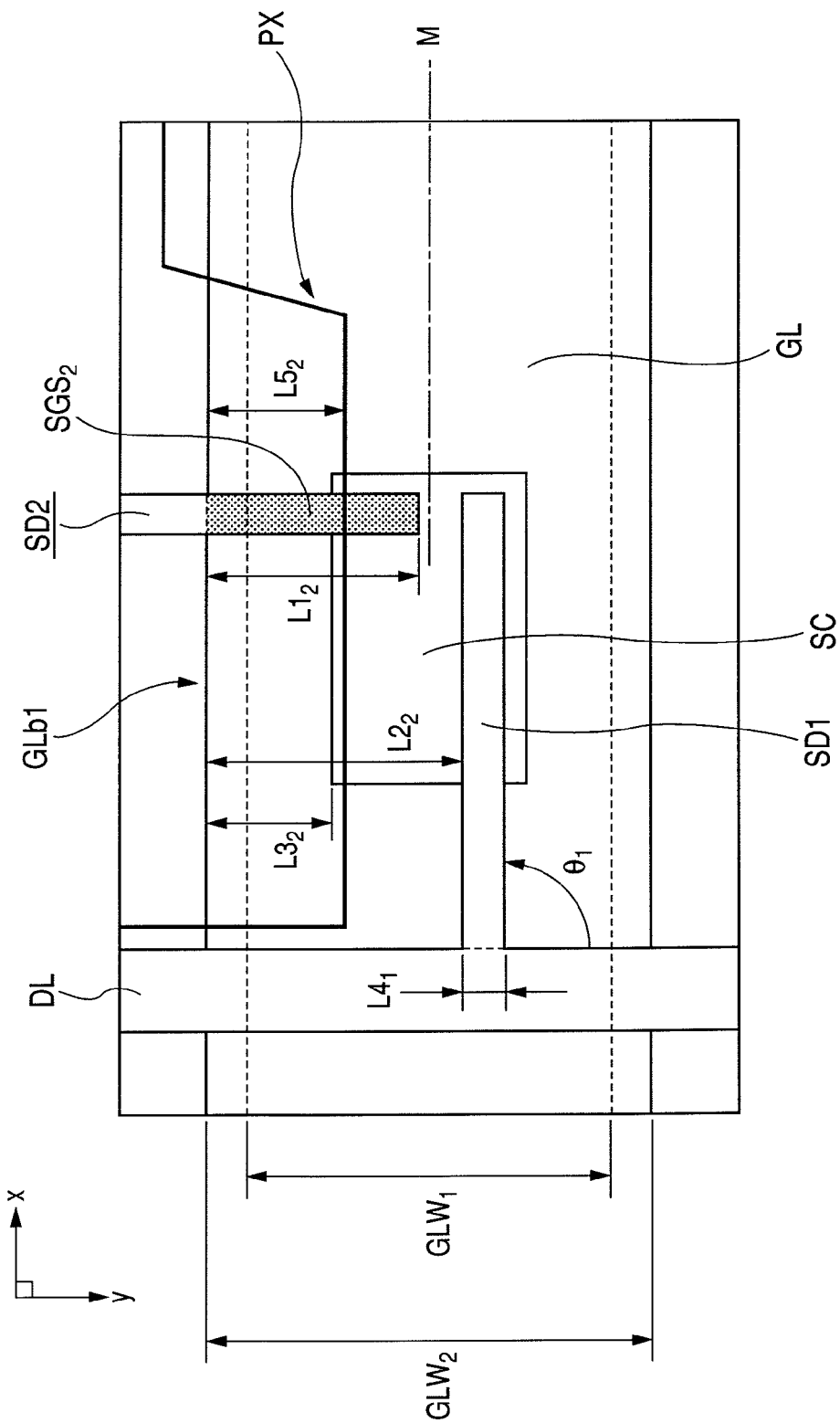
FIG. 11B shows a schematic plan view illustrating first feature of the TFT substrate in accordance with the third preferred embodiment.
Figure 11D:
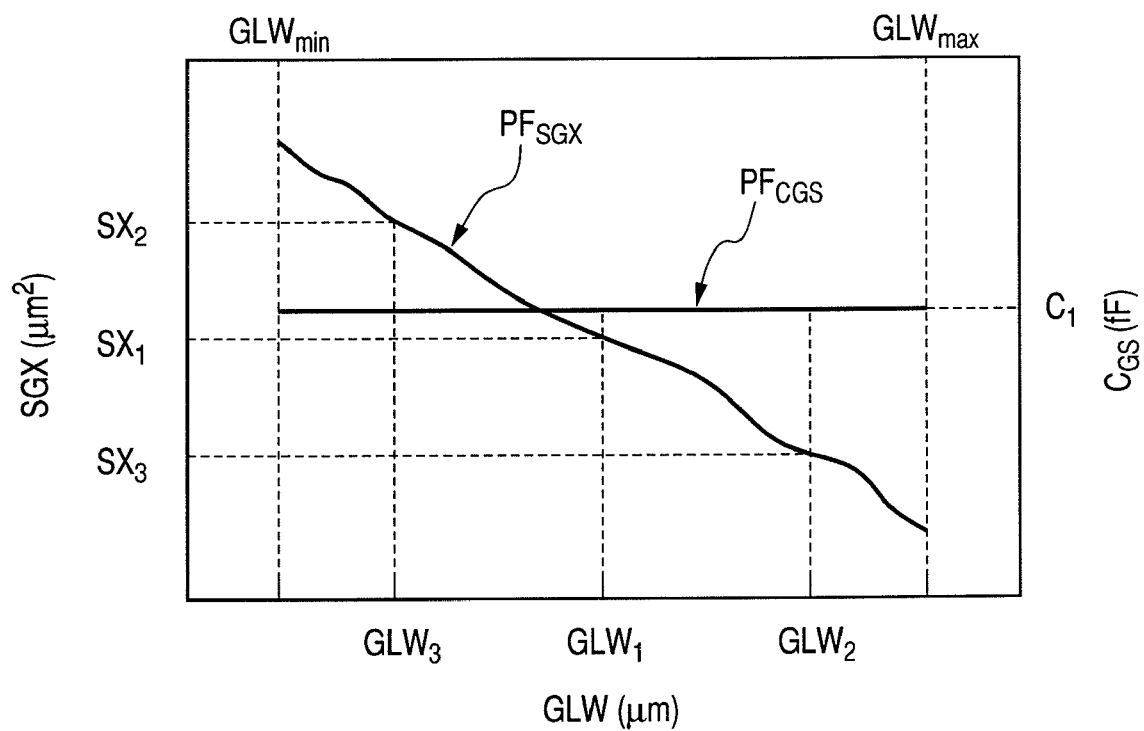
FIG. 11D shows a schematic diagram illustrating the relationship between the width of the scan signal line and the dimension of pixel electrode in the TFT substrate in accordance with the third preferred embodiment.

Now referring to FIGS. 11A to 11D, FIG. 11A shows a schematic plan view illustrating the basic arrangement of the TFT substrate in accordance with the third preferred embodiment. FIG. 11B shows a schematic plan view illustrating first feature of the TFT substrate in accordance with the third preferred embodiment. FIG. 11C shows a schematic plan view illustrating second feature of the TFT substrate in accordance with the third preferred embodiment. FIG. 11D shows a schematic diagram illustrating the relationship between the width of the scan signal line and the dimension of pixel electrode in the TFT substrate in accordance with the third preferred embodiment.

For each TFT of the TFT substrate 101 in accordance with the third preferred embodiment, as shown in FIG. 11A for example, the semiconductor layer SC, the drain electrode SD1 connected to the drain region of the semiconductor layer SC, the source electrode SD2 connected to the source region of the semiconductor layer SC, and part of the pixel electrode PX are formed in the overlap region overlapping with the scan signal line GL having a width (dimension in y direction) of $GLW_1$. The scan signal line GL, the semiconductor layer SC, the drain electrode SD1, the source electrode SD2, and the pixel electrode PX are formed in this case based on the layout data previously prepared. If each TFT is formed complying with the layout data of the designing stage, the distance $L1_1$ from the end GLb1 of the scan signal line GL opposing to the pixel electrode PX connected to the source electrode SD2 to the edge of the source electrode SD2 opposing to the drain electrode SD1 will be almost the same in each region having a TFT formed therein. Similarly, the distance $L2_1$ from the end GLb1 of the scan signal line GL to the edge of the drain electrode SD1 opposing to the source electrode SD2, and the distance $L3_1$ from the end GLb1 of the scan signal line GL to the end of the semiconductor layer SC, as well as the dimension L51 in y direction of the overlap region in plan view overlapping the pixel electrode PX with the scan signal line GL, in each region having a TFT formed therein, will also have almost the same value. Then the combined capacitance of first wiring capacitance $C_{GS1}$ in each pixel and second wiring capacitance CGS2 formed between the pixel electrode PX and the scan signal line GL will be almost equal.

In the drain electrode SD1 branched from the video signal line DL to be connected to the drain region of the semiconductor layer SC, the width (dimension in y direction) of the drain electrode SD1 is L41, the angle $\theta_1$ between the drain electrode SD1 and the video signal line DL is $\pi/2$ (rad.).

When manufacturing a TFT substrate 101 having such an arrangement as in the third preferred embodiment, even if the width of each scan signal line GL is formed so as to be $GLW_1$, based on the layout data, as shown in FIG. 11B, there may be cases where the width (finished dimension) of the actually formed scan signal line GL may be $GLW_2$ ($>GLW_1$), in other words may be wider than the width of the layout data in the designing stage.

In the TFT substrate 101 in accordance with the third preferred embodiment, the semiconductor layer SC, the drain electrode SD1, the source electrode SD2 are formed based on the layout data of the designing stage. For example as shown in FIG. 11B, the relationship between the distance $L1_2$ from the end GLb1 of the scan signal line GL to the edge of the source electrode SD2 opposing to the drain electrode SD1, the distance $L2_2$ from the end GLb1 of the scan signal line GL to the edge of the drain electrode SD1 opposing to the source electrode SD2, the distance $L3_2$ from the end GLb1 of the scan signal line GL to the end of the semiconductor layer SC, and three distances $L1_1$, $L2_1$, $L3_1$ shown in FIG. 11A are such that $L1_2 > L1_1$, $L2_2 > L2_1$, $L3_2 > L3_1$.

The surface area of the overlap region overlapping the source electrode SD2 with the scan signal line GL in plan view is widen because the width of the scan signal line GL is widen ($SGS_2 > SGS_1$), so that the wiring capacitance $CGS_1$ will be increased. Therefore, as shown in FIG. 11B, the dimension $L5_2$ in y direction of the overlap region in plan view overlapping the pixel electrode PX with the scan signal line GL must be shrunk ($L5_2 < L5_1$) to decrease the second wiring capacitance CGS2.

When manufacturing actually a TFT substrate 101, even when the substrate is formed so as for the width of each scan signal line GL to be GLW1 based on the layout data as shown in FIG. 11A, the width of the actually formed scan signal line GL (finished dimension) may be $GLW_3$ ($<GLW_1$), in other words may be narrower than the layout data of the designing stage, as shown in FIG. 11C.

In such a situation in the TFT substrate 101 in accordance with the third preferred embodiment, the semiconductor layer SC, the drain electrode SD1, and the source electrode SD2 are formed based on the layout data of the designing stage. Because of this, for example, as shown in FIG. 11C, the relationship between the distance $L1_3$ from the end GLb1 of the scan signal line GL to the edge of the source electrode SD2 opposing to the drain electrode SD1, the distance $L2_3$ from the end GLb1 of the scan signal line GL to the edge of the drain electrode SD1 opposing to the source electrode SD2, the distance $L3_3$ from the end GLb1 of the scan signal line GL to the end of the semiconductor layer SC, and three distances $L1_1$, $L2_1$, $L3_1$ shown in FIG. 11A is such that $L1_3 < L1_1$, $L2_3 < L2_1$, $L3_3 < L3_1$.

In this case the surface area of the overlap region overlapping the source electrode SD2 with the scan signal line GL in plan view is narrowed because the width of the scan signal line GL is narrower ($SGS_3 < SGS_1$), as a result the first wiring capacitance $CGS_1$ will be smaller. Therefore as shown in FIG. 11C the dimension $L5_3$ of the overlap region overlapping the pixel electrode PX with the scan signal line GL when viewing in plan view from the top should be enlarged ($L5_3 > L5_1$) so as to increase the second wiring capacitance $CGS_2$.

By doing this, even when the width of the scan signal line GL is different from the design value, the difference in the wiring capacitance $C_{GS}$ formed between the source electrode SD2 and the scan signal line GL in each pixel may be adjusted to the design value. Since the layout data of the semiconductor layer SC, the drain electrode SD1, the part of the source electrode SD2 opposing to the drain electrode SD1 are not changed, the channel width and the channel length for each TFT remain to the design values. This allows the value of the wiring capacitance $C_{GS}$ to set to the design value while maintaining the operation characteristics of the TFT.

In the third preferred embodiment, there are shown three possible cases in which the width of the actually formed scan signal line GL is either the width $GLW_1$ in the layout data of the design stage, or the width is a width $GLW_2$ which is wider than the width $GLW_1$ in the layout data of the design stage, or the width is a width $GLW_3$ which is narrower than the width $GLW_1$ in the layout data of the design stage. When measuring the width of the actually formed scan signal line GL, there may be cases in which some part may have a value between the width $GLW_1$ and the width $GLW_2$, another part may have a value wider than the width $GLW_2$, still another part may have a value between the width $GLW_1$ and the width $GLW_3$, and yet another part may have a value narrower than the width $GLW_3$. When measuring the TFT substrate 101 in accordance with the concept of the third preferred embodiment, for example, the dimension of the pixel electrode PX may be determined based on the relationship between the width GLW (micrometer) of the scan signal line GL and the length of the branched section SBR of the source electrode SD2 as shown in FIG. 11D. The graph shown in FIG. 11D indicates an example, illustrating the relationship $PF_{SGX}$ between the width of the scan signal line GL and the surface area SGX of the overlap region of the pixel electrode PX overlapping with the scan signal line GL when viewing in plan view, and the change $PFC_{CGS}$ in the wiring capacitance $C_{GS}$ at that time, the result found by the inventors of the present invention. In the graph the abscissa indicates the width GLW (micrometer) of the scan signal line GL, the ordinate in the left hand side indicates the surface area SGX (micrometer square) of the overlap region of the pixel electrode PX overlapping with the scan signal line GL, and the ordinate in the right hand side indicates the wiring capacitance CGS (femto-Farad) combining first wiring capacitance $C_{GS1}$ and second wiring capacitance $C_{GS2}$.

As can be appreciated from the foregoing description, by forming the pixel electrode PX such that when the width GLW of the scan signal line GL becomes wider the surface area of the overlap region SGX of the pixel electrode PX overlapping with the scan signal line GL when viewing in plan view decreases monotonously, the wiring capacitance $C_{GS}$ in each pixel will be almost equalized, allowing decreasing the uneven image quality caused by the difference in the wiring capacitance $C_{GS}$. Without widening the scan signal line GL as was done in the TFT substrate 101 of the prior art, the value of the wiring capacitance CGS in each pixel may be almost equalized, allowing preventing the number of aperture from decreasing.

Figure 12:
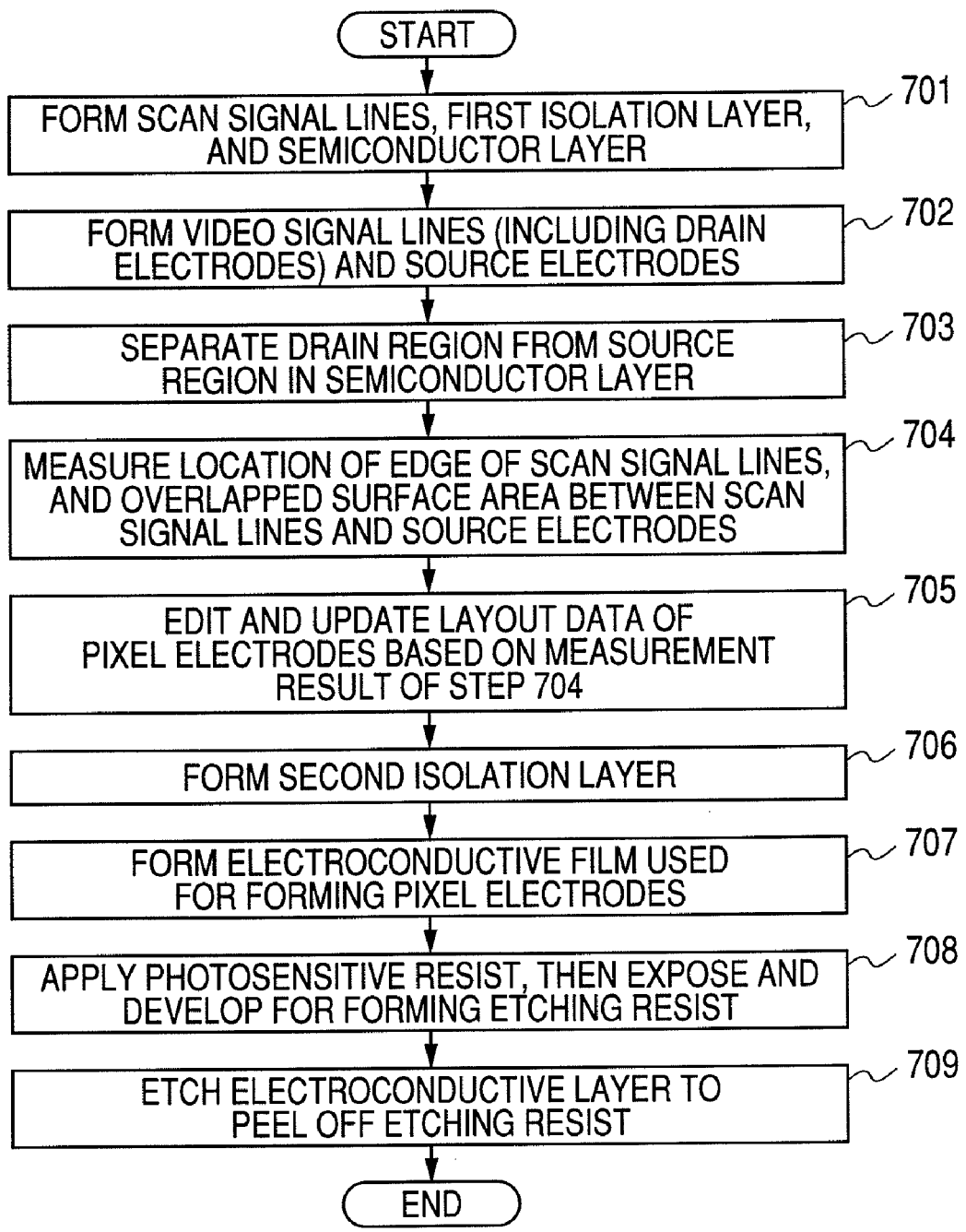
FIG. 12 shows a schematic flow diagram illustrating an exemplary manufacturing method of the TFT substrate in accordance with the third preferred embodiment.

Now referring to FIG. 12, there is shown a schematic flow diagram illustrating an exemplary manufacturing method of the TFT substrate in accordance with the third preferred embodiment.

For manufacturing the TFT substrate 101 in accordance with the third preferred embodiment, for example as shown in FIG. 12, plural scan signal lines GL, a first insulation layer PAS1, and a semiconductor layer SC is formed on a surface of an insulation substrate SUB such as glass substrate (step 701). Since step 701 performs the same process step as the sequential process steps of forming the scan signal line GL, the first insulation layer PAS1, and the semiconductor layer SC in a conventional manufacturing method of TFT substrate 101, detailed description thereof will be omitted.

Next, the video signal line DL (including the drain electrode SD1) and the source electrode SD2 are formed (step 702). By using the video signal line DL and the drain electrode SD1 as well as the source electrode SD2 as masks, the second semiconductor film SCF2 is etched to separate into the drain region and the source region (step 703). Step 702 and step 703 perform the same process step as the process step of forming the video signal line DL and the source electrode SD2 in the conventional manufacturing method of forming the TFT substrate 101, detailed description thereof will be omitted.

Next, the position of the end GLb1 of the scan signal line GL formed in step 701, and the overlap surface area of the scan signal line GL and the source electrode SD2 (the surface area of the overlap region SGS when viewing in plan view from the top) are measured (step 704). In step 704 the position and surface area may be measured by means of for example a step transition meter, a laser spectrometer, or an image taken with a camera, detailed description thereof will be omitted.

Next, based on the measurement result of step 704, the layout data of the pixel electrode PX is edited and updated (step 705). In step 705, for example, the surface area SGX of the overlap region of the pixel electrode PX overlapping with the scan signal line GL in plan view may be determined based on the graph of relationship as shown in FIG. 11D, and based on thus determined surface area, the dimension L5 in y direction of the overlap region of the pixel electrode PX overlapping with the scan signal line GL in plan view is edited and updated.

Next, the second insulation layer PAS2 is formed (step 706). In step 706 the same process step as that for forming the second insulation layer PAS2 in the conventional manufacturing method of the TFT substrate 101 is performed, the detailed description thereof will be omitted.

Next, the conductive film (such as ITO film) used for forming the pixel electrode PX is formed (step 707). Step 707 also is the same process step as the process step for forming a conductive film used for forming the pixel electrodes in the conventional manufacturing method of the TFT substrate 101, detailed description thereof will be omitted.

Next, after applying the photosensitive resist on the conductive film formed in step 705, the photosensitive resist is exposed and developed to form the etching resist (step 708). In step 708, when exposing the photosensitive resist, an exposure unit such as that called direct drawing exposure unit may be used. The direct drawing exposure unit in this case uses the layout data of the pixel electrode PX updated in step 705.

Next, after having etched the conductive layer, the etching resist is peeled off (removed) to form the pixel electrode PX (step 709). As a result the TFT substrate 101 having the arrangement as shown in FIG. 10A to FIG. 10C can be obtained.

In the foregoing description of manufacturing method, in step 708, when exposing the photosensitive resist, a direct drawing exposure unit is used by way of example. However, it is needless to say that in step 708, for example, the photosensitive resist may be exposed using an exposure mask created based on the layout data of the pixel electrode PX updated in step 705.

When applying the arrangement in accordance with the third preferred embodiment to the TFT substrate 101 to be used in a large liquid crystal display device, for example, the arrangement shown in FIG. 11A, the arrangement shown in FIG. 11B, and the arrangement shown in FIG. 11C may be found coexisting in one single TFT substrate 101. By forming as such arrangements, the uneven image quality (brightness unevenness) within one single display area of one liquid crystal display device may be decreased.

When applying the arrangement of the second preferred embodiment to the TFT substrate 101 to be used in a smaller liquid crystal display device, for example each TFT substrate 101 will have a slightly different arrangement such that one TFT substrate 101 cut out from a certain area of the mother glass 5 may have the arrangement as shown in FIG. 11B, while another TFT substrate 101 cut out from another certain area may have the arrangement as shown in FIG. 11C, and so on. By forming as such arrangements, the individual variability of image quality in plural liquid crystal display devices manufactured by using the TFT substrates 101 cut out from one single mother glass 5 may also be decreased.

It is true that the plan shape of the source electrode SD2 in the TFT substrate 101 in accordance with the third preferred embodiment may be such that the overlap region overlapping with the semiconductor layer SC may be of L-shape. In this case by manufacturing the TFT substrate 101 according to the procedure shown in FIG. 12, the wiring capacitance $C_{GS}$ in each pixel will be constant even when the width of the scan signal line GL changes, and the channel width and the channel length also will be constant.

In addition, the concept in accordance with the third preferred embodiment may be applied to the drain electrode SD1, when the plan shape thereof is of U-shape.

Figure 13:
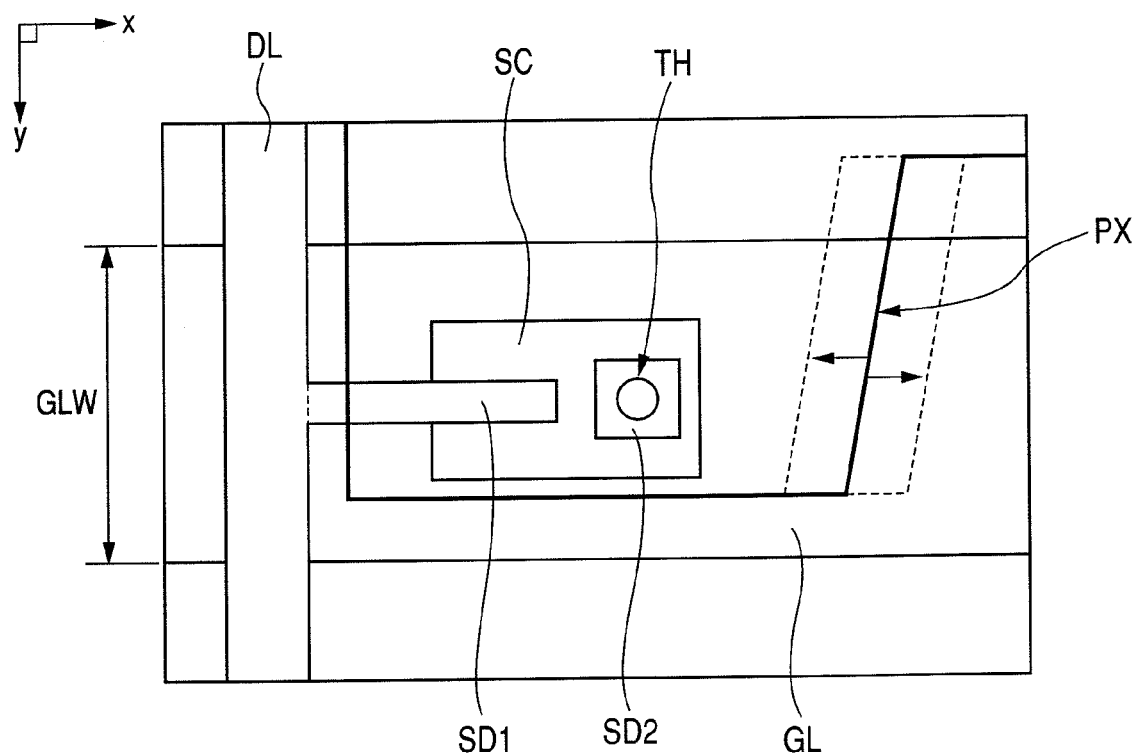
FIG. 13 shows a schematic plan view illustrating a variation of the TFT substrate in accordance with the third preferred embodiment.

Now referring to FIG. 13, there is shown a schematic plan view illustrating a variation of the TFT substrate in accordance with the third preferred embodiment.

In the first to third preferred embodiments, the examples described is that the source electrode SD2 has a region which is not overlapped with the scan signal line GL when viewing in plan view, the source electrode SD2 and the pixel electrode PX are connected in the non-overlap region with the scan signal line GL. This is because when forming the pixel electrode PX in the conventional, common TFT substrates, the pixel electrode PX is shaped so as not to overlap in plan view with the scan signal line GL connected to the gate of the TFT having the source electrode SD2 connected to the pixel electrode PX.

However, as in the TFT substrate 101 in accordance with the third preferred embodiment, when a part of the pixel electrode PX is formed so as to overlap, when viewing in plan view, with the scan signal line GL connected to the gate of the TFT having the source electrode SD2 connected to the pixel electrode PX, as shown in FIG. 13, a through hole TH is provided in the overlap region overlapping with the scan signal line GL to allow connecting the source electrode SD2 to the pixel electrode PX. In this manner the number of aperture can be increased.

In case of the TFT substrate 101 as shown in FIG. 13, the second wiring capacitance $C_{GS2}$ may be changed by enlarging or shrinking the dimension in x direction of the overlap region in the pixel electrode PX overlapping with the scan signal line GL when viewing in plan view.

Although the present invention has been described with reference to the preferred embodiments, by way of example, it is to be understood that the present invention is not considered to be limited to these embodiments herein given but may be modified without departing from the spirit and scope thereof.

For example, in the first to third preferred embodiments, the TFT substrate 101 having a pixel arrangement as shown in FIG. 3A to FIG. 3C has been described, the present invention is not limited thereto and may be applied to any TFT substrate having the TFTs of the arrangement as described in these embodiments.

When applying the present invention, not only any one arrangement from within those described in the first to third preferred embodiments may be used but a combination thereof, such as a combination of the arrangements of first and third embodiments, may also be applied as well.

Although in the first to third preferred embodiments a TFT substrate used for the liquid crystal display panel of the vertical electrolytic driving type has been described in which the pixel electrode PX is provided on the TFT substrate 101, and the opposing electrode CT is provided on the opposing substrate 102, the present invention is not limited thereto, and the pixel electrode PX and the opposing electrode CT may be both provided in the same TFT substrate 101.

Although in the first to third preferred embodiments a TFT substrate used in a liquid crystal display panel has been described, the present invention is not limited thereto, and may be equally applied to a TFT substrate used in a display panel of a light emitting display using an organic EL.

What is claimed is:

1. A display device comprising a display panel having a plurality of scan signal lines, a plurality of video signal lines which sterically intersect the plurality of scan signal lines, a plurality of TFTs placed in a matrix structure, and a plurality of pixel electrodes, wherein the TFT has a scan signal line, a semiconductor layer disposed on a region overlapping with the scan signal line when viewing in plan view from the top through an insulation layer, a drain electrode branched from a video signal line to be connected to a drain region of the semiconductor layer, and a source electrode to be connected to a source region of the semiconductor layer and to a pixel electrode;

wherein when the width of the scan signal line in the region to place one TFT of the plurality of TFTs is different from the width of the scan signal line in the region to place another TFT of the plurality of TFTs which is different from the one TFT, the channel width and the channel length in the one TFT is almost equal to the channel width and the channel length in the another TFT; and the surface area of the region of the source electrode of the one TFT overlapping with the scan signal line when viewing in plan view from the top is almost equal to the surface area of the overlap region of the source electrode of the another TFT overlapping with the scan signal line when viewing in plan view from the top.

2. The display device according to claim 1, wherein the plan size of the region of the source electrode of the one TFT overlapping with the scan signal line is almost equal to the plan size of the region of the source electrode of the another TFT overlapping with the scan signal line;

the extending direction of the part connecting the contact area of the drain electrode of the one TFT to the drain region with the video signal line is different from the extending direction of the part connecting the contact area of the drain electrode of the another TFT to the drain area with the video signal line.

3. The display device according to claim 1, wherein the source electrode is overlapped with the scan signal line when viewing in plan view from the top between the part contacting to the source region of the semiconductor layer and the part contacting to the pixel electrode, and has a part branched from the extending direction of the source electrode connecting the part in contact with the source region of the semiconductor layer with the part in contact with the pixel electrode;

the surface area of the region of the branched part of the source electrode of the one TFT overlapping with the scan signal line when viewing in plan view from the top is different from the surface area of the region of the branched part of the source electrode of the another TFT overlapping with the scan signal line when viewing in plan view from the top;

and the surface area of the entire part of the source electrode of the one TFT overlapping with the scan signal line when viewing in plan view from the top is almost equal to the surface area of the entire part of the source electrode of the another TFT overlapping with the scan signal line.

4. A display device comprising a display panel having a plurality of scan signal lines, a plurality of video signal lines sterically intersecting with the plurality of scan signal lines, a plurality of TFTs placed in a matrix structure, and a plurality of pixel electrodes, wherein the TFT has a scan signal line, a semiconductor layer placed on an insulation layer and overlapping with the scan signal line when viewing in plan view from the top, a drain electrode branched from a video signal line to be connected to the drain region of the semiconductor layer, and a source electrode to be connected to the source region of the semiconductor layer and the pixel electrode;

the pixel electrode has a part overlapping with the scan signal line when viewing in plan view from the top, to which is connected the gate of the TFT having the source electrode connected to the pixel electrode;

when the width of the scan signal line in the region to place one TFT among the plurality of TFTs is different from the width of the scan signal line in the region to place another TFT which is different from the one TFT, the surface area of the region of the pixel electrode to be connected to the source electrode of the one TFT overlapping with the scan signal line when viewing in plan view from the top is different from the surface area of the region of the pixel electrode to be connected to the source electrode of the another TFT overlapping with the scan signal line viewing in plan view from the top.

5. The display device according to claim 4, wherein the sum of the wiring capacitance generated between the source electrode of the one TFT and the scan signal line and the wiring capacitance generated between the pixel electrode to be connected to the source electrode and the scan signal line is almost equal to the sum of the wiring capacitance generated between the source electrode of the another TFT and the scan signal line and the wiring capacitance generated between the pixel electrode to be connected to the source electrode and the scan signal line.

6. The display device according to claim 4, wherein the source electrode and the pixel electrode of the TFT is connected to the scan signal line in the region overlapping with the scan signal line when viewing in plan view from the top.

7. The display device according to claim 5, wherein the source electrode and the pixel electrode of the TFT is connected to the scan signal line in the region overlapping with the scan signal line when viewing in plan view from the top.

8. A manufacturing method of a display device, for forming on a surface of an insulation substrate, a plurality of scan signal lines, a plurality of video signal lines which sterically intersect with the plurality of scan signal lines, a plurality of TFTs which are placed in a matrix structure, and a plurality of pixel electrodes, the method comprising the process steps of:

first process step of forming the plurality of scan signal lines;

second process step of measuring the width of the plurality of scan signal lines formed in the first process step in the vicinity of the region in which the plurality of TFTs are placed;

third process step of determining the position of forming the semiconductor layer of the TFT, the size and the position of forming the video signal and the drain electrode to be connected to the drain region of the semiconductor layer of the TFT, and the size and the position of forming the source electrode to be connected to the source region of the semiconductor layer of the TFT, based on the measurement result of the second process step;

fourth process step of forming a first insulation layer after the second process step;

fifth process step of forming the semiconductor layer of the TFT at the position determined in the third process step, after the fourth process step;

sixth process step of forming the video signal line and the drain electrode and the source electrode of the size determined in the third process step at the position determined in the third process step, after the fifth process step;

seventh process step of forming a second insulation layer after the sixth process step; and eighth process step of forming the pixel electrode to be connected to the source electrode, after the seventh process step;

wherein the third process step determines the size and forming position of the drain electrode and the source electrode, without regard of the width of the scan signal line, such that the surface area of the region of the source electrode of each TFT overlapping with the scan signal line is equally formed, and such that the channel width and the channel length of each TFT are equally formed.

9. A manufacturing method of a display device, for forming on a surface of an insulation substrate, a plurality of scan signal lines, a plurality of video signal lines which sterically intersect with the plurality of scan signal lines, a plurality of TFTs which are placed in a matrix structure, and a plurality of pixel electrodes, the method comprising the process steps of:

first process step of forming the plurality of scan signal lines;

second process step of forming a first insulation layer after the first process step;

third process step of forming the semiconductor layer of the TFT after the second process step;

fourth process step of measuring the distance from one edge of the scan signal line to the semiconductor layer after the third process step;

fifth process step of determining the size of source electrode to be connected to the source region of the semiconductor layer of the TFT, based on the measurement result of the fourth process step;

sixth process step of forming the source electrode of the size determined in the fifth process step, the plurality of video signal lines, and the drain electrode to be connected to the drain region of the semiconductor layer of the TFT, after the fourth process step and the fifth process step;

seventh process step of forming a second insulation layer after the sixth process step; and eighth process step of forming the pixel electrode to be connected to the source electrode after the seventh process step;

wherein the size of the source electrode is determined the fifth process step by providing a part which overlaps with the scan signal line and is branched from the extending direction of the source electrode connecting the part in contact with the source region of the semiconductor layer with the part connecting to the pixel electrode, between the part in contact with the source region of the scan signal line and the part connecting to the pixel electrode in the each source electrode, so as to narrow the surface area of the branching part when the distance from one edge of the scan signal line to the semiconductor layer is longer, or so as to enlarge the surface area of the branching part when the distance from one edge of the scan signal line to the semiconductor layer is shorter, in order to evenly form the plan surface area of the region overlapping each source electrode with each scan signal line when viewing in plan view from the top.

10. A manufacturing method of a display device, for forming on a surface of an insulation substrate, a plurality of scan signal lines, a plurality of video signal lines which sterically intersect with the plurality of scan signal lines, a plurality of TFTs which are placed in a matrix structure, and a plurality of pixel electrodes, the method comprising the process steps of:

first pixel electrode of forming the plurality of scan signal lines;

second process step of forming a first insulation layer;

third process step of forming the semiconductor layer of the TFT after the second process step;

fourth process step of forming a drain electrode to be connected to the drain region of the semiconductor layer of the TFT and to the video signal line, and a source electrode to be connected to the source region of the semiconductor layer of the TFT, after the third process step;

fifth process step of measuring the surface area of the region of the source electrode overlapping with the scan signal line when viewing in plan view from the top after the fourth process step;

sixth process step of determining the plan size of the region of a pixel electrode to be connected to the source electrode overlapping on the plan with the scan signal line to which the gate of the TFT having the source electrode to be connected to the pixel electrode is connected, based on the measurement result of the fifth process step;

seventh process step of forming a second insulation layer after the fifth process step and the sixth process step; and eighth process step of forming the pixel electrode of the size determined in the sixth process step, after the seventh process step;

wherein the plan size of the pixel electrode is determined in the sixth process step so as to narrow the surface area of the plan region of the pixel electrode to be connected to the source electrode overlapping with the scan signal line when the surface area of the plan region of the source electrode overlapping with the scan signal line is wider, and so as to enlarge the surface area of the plan region of the pixel electrode to be connected to the source electrode overlapping with the scan signal line when the surface area of the plan region of the source electrode overlapping with the scan signal line is narrower.

11. A display device comprising a display panel having a plurality of scan signal lines, a plurality of video signal lines which sterically intersect the plurality of scan signal lines, a plurality of TFTs placed in a matrix structure, and a plurality of pixel electrodes, wherein the TFT has a scan signal line, a semiconductor layer disposed on a region overlapping with the scan signal line when viewing in plan view from the top through an insulation layer, a drain electrode branched from a video signal line to be connected to a drain region of the semiconductor layer, and a source electrode to be connected to a source region of the semiconductor layer and to a pixel electrode;

wherein when the width GLW1 of the scan signal line in the region to place one TFT of the plurality of TFTs is larger than the width GLW2 of the scan signal line in the region to place another TFT of the plurality of TFTs which is different from the one TFT, the channel width and the channel length in the one TFT is almost equal to the channel width and the channel length in the another TFT; and when the length in the extending direction of the source electrode of the region overlapping the source electrode with the scan signal line, when viewing in plan view from the top, of the one TFT is designated to as L1, and the length in the extending direction of the source electrode of the region overlapping the source electrode with the scan signal line, when viewing in plan view from the top, of the another TFT is designated to as L2, then L1/GW1<L2/GW2.

12. A display device comprising a display panel having a plurality of scan signal lines, a plurality of video signal lines which sterically intersect the plurality of scan signal lines, a plurality of TFTs placed in a matrix structure, and a plurality of pixel electrodes, wherein the TFT has a scan signal line, a semiconductor layer disposed on a region overlapping with the scan signal line when viewing in plan view from the top through an insulation layer, a drain electrode branched from a video signal line to be connected to a drain region of the semiconductor layer, and a source electrode to be connected to a source region of the semiconductor layer and to a pixel electrode;

wherein when the width GLW1 of the scan signal line in the region to place one TFT of the plurality of TFTs is narrower than the width GLW2 of the scan signal line in the region to place another TFT of the plurality of TFTs which is different from the one TFT, the channel width and the channel length in the one TFT is almost equal to the channel width and the channel length in the another TFT; and when the length in the extending direction of the source electrode of the region overlapping the source electrode with the scan signal line, when viewing in plan view from the top, of the one TFT is designated to as L1, and the length in the extending direction of the source electrode of the region overlapping the source electrode with the scan signal line, when viewing in plan view from the top, of the another TFT is designated to as L2, then L1/GW1>L2/GW2.

13. A display device comprising a display panel having a plurality of scan signal lines, a plurality of video signal lines which sterically intersect the plurality of scan signal lines, a plurality of TFTs placed in a matrix structure, and a plurality of pixel electrodes, wherein the TFT has a scan signal line, a semiconductor layer disposed on a region overlapping with the scan signal line when viewing in plan view from the top through an insulation layer, a drain electrode branched from a video signal line to be connected to a drain region of the semiconductor layer, and a source electrode to be connected to a source region of the semiconductor layer and to a pixel electrode;

wherein when the width GLW1 of the scan signal line in the region to place one TFT of the plurality of TFTs is larger than the width GLW2 of the scan signal line in the region to place another TFT of the plurality of TFTs which is different from the one TFT, the channel width and the channel length in the one TFT is almost equal to the channel width and the channel length in the another TFT;

wherein the source electrode has a region overlapping with the scan signal line in plan view and branched from the extending direction of the source electrode to connect the part in contact with the source region of the semiconductor layer and the part in contact with the pixel electrode, between the part in contact with the source region of the semiconductor layer and the part in contact with the pixel electrode;

wherein when the length of the branched part of the source electrode of the one TFT is designated to as SGS1, and the length of the branched part of the source electrode of the another TFT is designated to as SGS2, then SGS1<SGS2.

14. The display device according to claim 1, wherein the display panel is a liquid crystal display panel having liquid crystal encapsulated between two substrates.

15. The display device according to claim 4, wherein the display panel is a liquid crystal display panel having liquid crystal encapsulated between two substrates.

16. The display device according to claim 11, wherein the display panel is a liquid crystal display panel having liquid crystal encapsulated between two substrates.

17. The display device according to claim 12, wherein the display panel is a liquid crystal display panel having liquid crystal encapsulated between two substrates.

18. The display device according to claim 13, wherein the display panel is a liquid crystal display panel having liquid crystal encapsulated between two substrates.

* * * * *